United States Patent [19]

Van Roozendaal et al.

[11] Patent Number: 5,248,892
[45] Date of Patent: Sep. 28, 1993

[54] SEMICONDUCTOR DEVICE PROVIDED WITH A PROTECTION CIRCUIT

[75] Inventors: Leonardus J. Van Roozendaal; Reinier De Werdt, both of Eindhoven, Netherlands

[73] Assignee: U.S. Philips Corporation, New York, N.Y.

[21] Appl. No.: 693,765

[22] Filed: Apr. 26, 1991

Related U.S. Application Data

[63] Continuation of Ser. No. 475,617, Feb. 2, 1990, abandoned.

[30] Foreign Application Priority Data

Mar. 13, 1989 [NL] Netherlands ............. 8900593

[51] Int. Cl.⁵ ............................... H01L 23/62
[52] U.S. Cl. ............................... 257/357; 257/358; 257/361; 257/384
[58] Field of Search ............... 357/23.13; 307/542; 257/357, 358, 361, 384

[56] References Cited

U.S. PATENT DOCUMENTS

| | | | |
|---|---|---|---|
| 4,492,974 | 1/1985 | Yoshida et al. | 357/23.13 |
| 4,803,527 | 2/1989 | Hatta et al. | 357/23.13 |
| 4,825,280 | 4/1989 | Chen et al. | 357/23.13 |
| 4,845,536 | 7/1989 | Heinecke et al. | 357/23.13 |
| 4,893,157 | 1/1990 | Miyazawa et al. | 357/23.13 |
| 5,019,888 | 5/1991 | Scott et al. | 357/23.18 |

FOREIGN PATENT DOCUMENTS

| | | | |
|---|---|---|---|
| 57-130468 | 8/1982 | Japan | 357/23.13 |
| 59-080973 | 5/1984 | Japan | 357/23.13 |
| 61-214576 | 9/1986 | Japan | 357/23.13 |
| 62-020376 | 1/1987 | Japan | 357/23.13 |

*Primary Examiner*—Andrew J. James
*Assistant Examiner*—Hung Xuan Dang
*Attorney, Agent, or Firm*—Paul R. Miller

[57] ABSTRACT

The invention relates to an integrated circuit connected via a first connection conductor (61) to a first contact area. Between the first connection conductor (61) and a second connection conductor (63), a protection element (8) is connected, which protects the circuit especially from electrostatic discharges. The protection element (8) comprises an active zone (81), which is covered with metal silicide (15) and forms a pn junction (86) with the adjoining part (83) of the semiconductor body (10). On the metal silicide (15), the active zone (81) is provided with an electrode (16), through which the zone (81) is connected to the first connection conductor (61). The use of metal silicide in the integrated circuit in itself has great advantages, but in the protection element the metal silicide layer is found to give rise to a considerably lower reliability. The invention has for its object to obviate this disadvantage without it being necessary to modify the manufacturing process. According to the invention, in order to improve the uniformity of the current distribution over the pn junction (86), between the electrode (16) and the pn junction (86), a resistance element (9, 91, 92) is connected in series with the protection element (8) directly to the active zone (81) of the protection element (8), whose width is substantially equal to the width of the active zone (81). Such a resistance element can be entirely realized within the process of manufacturing the integrated circuit.

18 Claims, 12 Drawing Sheets

SEMICONDUCTOR DEVICE PROVIDED WITH A PROTECTION CIRCUIT

This is a continuation of application Ser. No. 07/475,617, filed Feb. 2, 1990, now abandoned.

The invention relates to a semiconductor device comprising a semiconductor body provided with an integrated circuit having at least one transistor, which comprises a zone located in the semiconductor body and covered with metal silicide, the circuit being connected through a first connection conductor to a contact area, and a protection element being connected between the first connection conductor and a second connection conductor, which element comprises an active zone located in the semiconductor body forming with an adjoining part of the semiconductor body a pn junction, is covered at the surface of the semiconductor body with a layer of metal silicide and which is coupled via an electrode to the first connection conductor.

The protection element should provide for a good conducting current path to the second connection conductor when the voltage at the first connection conductor exceeds a given threshold value associated with the protection element. The threshold value is chosen so that the circuit is prevented from being damaged. When the voltage has then fallen to a safe value, the protection element again returns to its original non-conducting state. Such a protection can be used with every kind of connection conductor of the semiconductor device, such as, for example, an input line, an output line or a supply line.

The protection element more particularly has for its object to protect the circuit from electrostatic discharges. In the finished product, such a discharge occurs when a statically charged body, such as, for example, a human body, contacts a connection pin of the semiconductor device, which is connected to a connection conductor. The electrostatic discharge occurring may lead in such a case to a voltage of a few thousands to a few tens of thousands of volts. In general, a fraction of this voltage is sufficient to seriously damage the circuit, which is connected to the connection conductor. However, also already during manufacture, the semiconductor device can be irreparably damaged by static electricity, for example, due to friction of the semiconductor device with the environment.

BACKGROUND OF THE INVENTION

Especially MOS-IC's are sensitive to electrostatic discharges. The gate dielectric used therein in existing IC's is so thin that it can break down at a voltage of about 20 to 80 V. However, also bipolar IC's can be damaged, though mostly at higher voltages, from, for example, about 400 V. In the latter case, this is often due to a damage of the base-emitter junction by an abrupt current pulse associated with the discharge. At the area of the pn junction, such a quantity of heat can be dissipated that the semiconductor material recrystallizes locally. This often leads to a permanently weak spot in the pn junction.

In the advancing development of integrated circuits and the technology used therewith, increasingly higher requirements are imposed on the packing density, as a result of which increasingly smaller dimensions are aimed at. As the dimensions in a semiconductor device decrease, the sensitivity to an electrostatic discharge increases. Thus, it becomes more important to provide the connection conductors of the circuit with efficient protection elements, which can adequately counteract the disadvantageous consequences of an electrostatic discharge.

During normal operation, the protection element must not adversely affect the operation of the circuit. This means inter alia that in this case the element must not convey current and that any leakage current must be as small as possible. If, however, an extraordinarily high voltage, exceeding the threshold value abruptly occurs at the connection conductor, the protection element must provide, as soon as possible, for a good conducting current path to the second contact area so that the released charge can be rapidly dissipated along it and it is avoided that the circuit is damaged.

In order to satisfy this double requirement, the protection element may be provided, for example, with a pn junction, which during normal operation of the circuit is biased in the reverse direction. Normally, apart from a small leakage current, no current can flow through the protection element so that the operation of the circuit is not adversely affected. If, however, the voltage across the pn junction exceeds the breakdown voltage thereof, avalanche breakdown can occur. The pn junction then reaches a good conducting state and thus provides for a good conducting current path to the second contact area until the voltage has fallen again.

The breakdown voltage has a given fixed value associated with the pn junction and depends inter alia upon the doping concentrations on either side of the junction. When these concentrations are suitably chosen, the breakdown voltage can be adjusted within certain limits to a suitable value, which then constitutes the threshold value of the protection element. For a satisfactory protection, the pn junction is constructed so that it breaks down before the voltage at the connection conductor has increased to such a value that the circuit can be damaged. Provided that during the breakdown the current density in the protection element has not become too high, the element returns again to its original state afterwards when the voltage has fallen again to a safe level.

The protection element may be constructed as a diode. The pn junction thereof is then used to protect the circuit. Other configurations are also possible. The protection element may, for example, also take the form of a bipolar transistor. The collector-base junction may then be used, for example, to protect the circuit. Another possible configuration is that of a field effect transistor, in which the pn junction between the source or drain and the adjoining part of the semiconductor body may be utilized. In all these cases, the threshold value of the protection element is determined by the breakdown voltage of the pn junction. In general, the choice will mainly be determined by the processing steps available for the manufacture of the remaining part of the semiconductor device.

In an article entitled "Electrical Overstress NMos Silicided Devices" published in "Electrical Overstress/Electrical Discharge Symposium Proceedings 1987, EOS-9, pp. 265-273", a semiconductor device of the kind mentioned in the opening paragraph is described, in which an NMOS transistor is used as the protection element. The transistor comprises an n-type source and an n-type drain, which are both located in a p-type semiconductor body and are mutually separated by a part thereof. In this case, the drain constitutes the active zone mentioned in the opening paragraph. The drain forms with the surrounding part of the semiconductor body the pn junction, which breaks down when the voltage across it exceeds the threshold value. Both the source and the drain of the transistor are coated for the major part with a layer of titanium silicide. The drain is provided with electrodes connected to a connection conductor.

In recent years, use has more or less been made for electrical contacts to semiconductor zones of metal silicides. The zone is then covered with a layer of metal silicide before an electrode, often consisting of aluminium, is provided. In general, the metal silicide can be provided in a self-registered manner, as a result of which the whole exposed part of the zone is provided with the silicide layer without an additional mask being required. This fact as well as the low resistivity, the suitability for use in conventional manufacturing processes and the reliability of the contact between the silicide layer and the subjacent silicon are important advantages offered by metal silicides, such as, for example, titanium silicide.

In the protection elements as described above, the use of metal silicides proves to have an unfavourable influence, however. According to the aforementioned article, NMOS transistors, whose drain is covered with titanium silicide before the electrodes are provided, are 30 to 50% less reliable than comparable transistors, in which the electrodes are contacted directly on the drain by an aluminium contact. A protection element of the first kind is capable, for example, of withstanding considerably lower voltages and current strengths. Such a protection element will thus sooner be destroyed by an electrostatic discharge, which jeopardizes the circuit to be protected.

This problem can of course be solved in that the active zones of the protection element are masked during the deposition of the metal silicide. However, the manufacture of the protection element must deviate as slightly as possible from the process of manufacturing the remaining part of the semiconductor device, in which the use of metal silicides is just desirable and the metal silicides is often provided without a mask. If the metal silicide layer should be omitted solely in the protection element, at least an additional mask would be required.

SUMMARY OF THE INVENTION

The invention has inter alia for its object to provide a semiconductor device of the kind mentioned in the opening paragraph, which is provided with a protection element, which comprises an active zone covered with metal silicide and nevertheless protects in a reliable manner the integrated circuit from voltages occurring at the connection conductor.

According to the invention, a semiconductor device of the kind mentioned in the opening paragraph is characterized in that, in order to improve the uniformity of the current distribution over the pn junction between the electrodes and the pn junction in series with the protection element, a resistance element is directly connected to the active zone of the protection element, whose width is substantially equal to the width of the active zone.

Examinations on which the invention is based have shown that the junction between the metal silicide layer and the subjacent semiconductor body is fairly irregular. This will be explained more fully in the following description of the Figures. The invention is based inter alia on the recognition of the fact that this irregularity leads to local resistance variations. Due to the great difference in resistivity of the silicide layer and of the semiconductor body, at areas at which the silicide layer protrudes, the resistance to the pn junction can be considerably lower than at other areas. It is presumed that an electric current converges with a decreased resistance to these areas, as a result of which only a small part of the pn junction is used effectively. This convergence can take place already in the low-ohmic electrode, i.e. before the current reaches the silicide. This locally leads to a strongly increased current density, as a result of which the overall current that can pass through the protection element without damaging it is considerably smaller than if a practically homogeneous current should pass through the element.

Due to the fact that, according to the invention, the resistance element is connected in series with the zone between the electrode and the pn junction, the overall resistance to the pn junction is increased, as a result of which the resistance variations have relatively less influence. Thus, it is counteracted that the current converges in the electrode. The current also remains practically uniform in the resistance element, as a result of which the current leaves the resistance element throughout the width of the resistance element. Since according to the invention the width of the resistance element is practically equal to the width of the active zone, the current is thus supplied thereto practically uniformly. The occurrence of a convergence of the current between the resistance element and the active zone is then counteracted in that, according to the invention, the resistance element directly contacts the active zone so that the current is supplied to the active zone with practically the same uniformity as that with which it has left the resistance element.

Due to this improved uniformity in the current distribution, the protection element according to the invention is capable of withstanding a considerably larger current and voltage than the known protection element. Due to the fact that the resistance element is arranged between the connection conductor and the protection element and is not arranged in the connection conductor itself, the operation of the circuit is not or substantially not adversely affected by the presence thereof. Moreover, the manufacturing process is not or substantially not complicated by the use of the invention. As will be described below in greater detail, the resistance element may be manufactured, for example, without additional processing steps together with a MOS circuit.

BRIEF DESCRIPTION OF THE DRAWINGS

The invention will now be described more fully with reference to a few embodiments and the drawing. In the drawing:

FIG. 15A shows a cross-section taken on the line A—A in FIG. 14, while

FIGS. 16, 16A, 16B, 17A, 17B, 18A, 18B, 19A and 19B show in cross-section the semiconductor device of FIGS. 15A and 15B at successive stages of manufacture;

FIG. 21A shows a cross-section taken on the line A—A in FIG. 20, while

DESCRIPTION OF THE INVENTION

Figure 1:
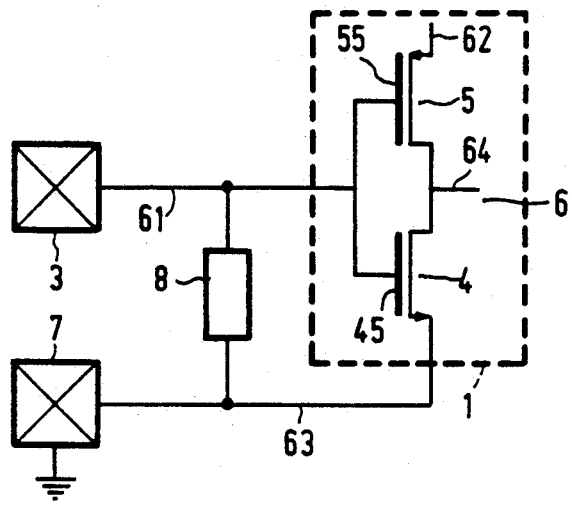
FIG. 1 shows an electric equivalent circuit diagram of a conventional semiconductor device provided with a protection element.

The Figures are schematic and not drawn to scale. For the sake of clarity, especially given dimensions are greatly exaggerated. Corresponding parts are generally designated by the same reference numerals. Semiconductor zones of the same conductivity type are generally cross-hatched in the same direction.

A conventional semiconductor device provided with a protection element is shown diagrammatically in FIG. 1. The device comprises a circuit 1, which is connected via a connection conductor 61 to a first contact area 3. The kind of circuit is not essential to the invention. For example, this circuit may be a logic circuit, but a memory is also possible. Moreover, the invention can be used both in MOS circuits and in bipolar circuits. In FIG. 1, by way of example of a circuit, a CMOS inverter 6 is used, which is arranged between a first supply line 62 and a second supply line 63. The inverter 6 comprises two complementary field effect transistors 4, 5, whose gate electrodes 45, 55 are connected to an input line 61, which in this example constitutes the connection conductor to be protected. The inverter 6 further comprises an output line 64, which is coupled to the drains 42, 52 of both transistors 4, 5.

Figure 2:
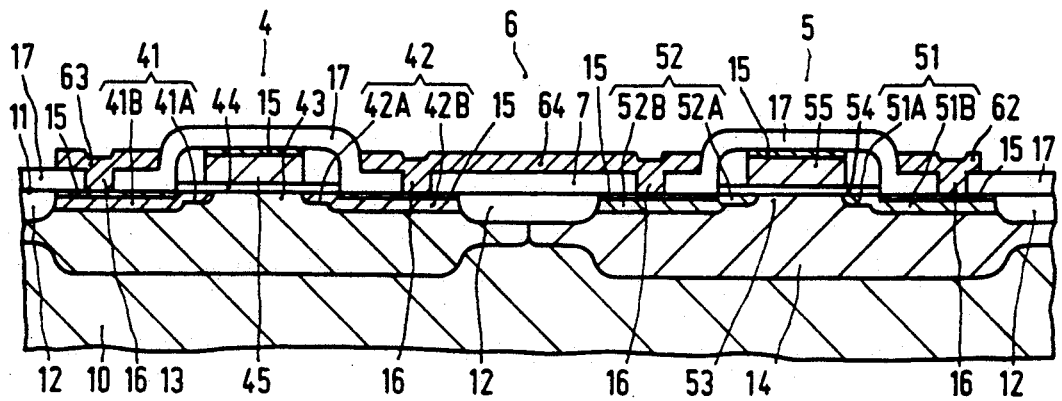
FIG. 2 shows a cross-section of the CMOS inverter of FIG. 1.

The transistors 4, 5 are integrated in a silicon substrate 10 (cf. FIG. 2), which is doped in this case with boron and is therefore of the p-type. A suitable boron doping is about $10^{15}$ cm$^{-3}$. The n-channel transistor 4 lies in a semiconductor well 13 of the p-type (designated hereinafter as p-well), which is doped slightly more highly than the substrate 10 itself. The maximum boron doping in the p-well 13 is about $3 \times 10^{16}$ cm$^{-3}$. The P-channel transistor 5 is provided in an n-type semiconductor well 14 (designated hereinafter as n-well), which is doped with phosphorus at a dose of about $5 \times 10^{16}$ cm$^{-3}$. The transistors 4, 5 are both laterally bounded by parts of a silicon oxide layer 12 sunken into the semiconductor body.

The n-channel transistor comprises an n-type source 41 and an n-type drain 42, which are mutually separated by a part of the p-well 13, which adjoins the surface 11 and constitutes a channel region 43 of the transistor. The source 41 and the drain 42 both have a comparatively weakly doped part 41A, 42A and a comparatively highly doped part 41B, 42B, and the weakly doped parts 41A, 42A adjoin the channel region 43. Such a construction, not essential to the invention, has for its object to counteract disadvantageous effects which can occur in MOS transistors having very small channel lengths of, for example, less than 3 μm. The comparatively weakly doped parts 41A, 42A are doped with phosphorus in a concentration of about $10^{18}$ cm$^{-3}$, while the phosphorus concentration in the comparatively highly doped parts 41B, 42B is about $10^{20}$ cm$^{-3}$. The p-channel transistor 5 comprises a p-type source 51 and a p-type drain 52 doped with boron, between which a part of the n-well 14 is located, which adjoins the surface 11 and constitutes a channel region 53 of the transistor. As in the n-channel transistor 4, the source 51 and the drain 52 of the p-channel transistor 5 comprise both a comparatively weakly doped part 51A, 52A and a comparatively highly doped part 51B, 52B. In the weakly doped parts 51A, 52A, the boron concentration is about $10^{18}$ cm$^{-3}$, while in the remaining parts 51B, 52B of the source and the drain the boron is provided at a dose of about $10^{20}$ cm$^{-3}$.

Both transistors 4, 5 are provided with a gate electrode 45, 55 arranged above the channel region 43, 53 which gate electrode is insulated therefrom by a thin gate dielectric 44, 54, in this case an about 17.5 nm thick silicon oxide layer. For the gate electrodes 45, 55, use is made of polycrystalline silicon, which is n-type doped with phosphorus. Metal silicide 15, in this case titanium silicide, is located on the source 41, 51, the drain 42, 52 and the gate electrode 45, 55 of both transistors 4, 5 in order to reduce the (sheet) resistance to these parts. The assembly is covered with a comparatively thick silicon oxide layer 17, in which contact windows are provided at various areas. Via the contact windows, aluminium electrodes 16, in this case provided with a thin layer of titanium-tungsten which counteracts migration of aluminium to the substrate, are arranged on the titanium silicide layers 15. By means of the electrodes, the various parts of the circuit can be connected to the wiring 62–64 located on the silicon oxide layer 17. Outside the drawing, the gate electrodes 45, 55 of both transistors are thus coupled to the input line.

During normal operation, a voltage between about 0 and 5 V is applied to the input line 61 (cf. FIG. 1) in order to drive the inverter 6. If a considerably higher voltage is applied to the input line 61, for example due to an electrostatic discharge, it must be avoided that this voltage is also applied to the gate electrodes 45, 55 because otherwise the transistors 4, 5 could be damaged. The gate dielectric 44, 54 could break down, for example, which may lead to a permanent deviation in the electrical properties of the transistors, such as, for example, a permanent shortcircuit to the channel region 43, 53. In modern IC processes, for the gate dielectric use is made of silicon oxide layers having a thickness between 10 and 50 nm. It has been found that such a layer can break down if the voltage across it increases during an electrostatic discharge to more than about 20 to 80 V.

Due to an electrostatic discharge, the voltage at the input line 61 can readily increase to a multiple of this value. In practice, friction may cause charging currents to occur, which vary from a few hundreds of picoamperes to a few microamperes leading to an overall charge on the body between 0.1 and 5 microcoulombs. If there is started from a human body which has with respect to its environment a capacitance of 150 pF and a charge of 3 μC, this corresponds to a voltage of 20 kV. This is about thousand times the voltage at which the circuit 1 is liable to be seriously damaged.

In order to avoid that the circuit 1 is irreparably damaged, a protection element 8 is connected between the input line 61 and a second contact area 7. The protection element 8 is designed so that during normal operation of the circuit the does not adversely affect its operation. In this state, no or substantially no current flows through the protection element 8. If, however, the voltage at the input line 61 exceeds a given threshold value, for example due to an electrostatic discharge, the protection element 8 becomes conducting and thus provides a good conducting current path to the second contact area 7, along which the released charge can be dissipated. By choosing the threshold value to be lower than the voltage at which the circuit 1 is jeopardized, it can thus be avoided that the circuit 1 is damaged. When the voltage at the input line 61 has fallen again below the threshold value, the protection element 8 again returns to its original non-conducting state.

Figure 3:
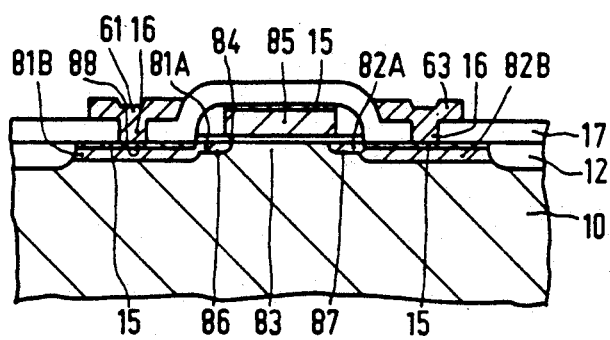
FIG. 3 shows a cross-section of an embodiment of the protection element of FIG. 1.

An embodiment of such a protection element 8 is shown in cross-section in FIG. 3. In this embodiment it comprises two active zones 81, 82, which are n-type conducting. The active zones 81, 82 both laterally adjoin the sunken silicon oxide layer 12 and form a pn junction 86 and 87, respectively, with the adjoining part of the p-type substrate 10. The active zones 81, 82 each comprise a comparatively weakly doped part 81A, 82A and a comparatively highly doped part 81B, 82B. The doping concentration and the depth of the zones are practically equal to those of the source 41 and the drain 42 of the n-type field effect transistor. The active zones 81, 82 can therefore be provided in the same processing step as the source 41 and the drain 42. Between the active zones 81, 82, the substrate is covered with an about 17.5 nm thick gate dielectric 84 of silicon oxide, on which a gate electrode 85 of doped polycrystalline silicon is provided. At the surface, the active zones 81, 82 are covered for the major part with metal silicide 15 which in this example is titanium silicide. The assembly is covered with a comparatively thick silicon oxide layer 17, which is provided with contact windows above the active zones 81, 82. In the contact windows, aluminium electrodes 16, by means of which the first active zone 81 is connected to the input line 61 and the second active zone 82 is coupled to the second input line 63 thus is applied to a reference voltage $V_{ss}$ (cf. also FIG. 1), are arranged on the titanium silicide 15, which covers the active zones 81, 82. The part of the substrate adjoining the active zones 81, 82 is applied via a substrate connection (not shown) to $V_{ss}$.

During normal operation of the circuit 1, in which the voltage at the input line 61 lies between 0 and 5 V, the pn junction 86 of the first active zone 81 is biased in the reverse direction. Apart from a small leakage current, in this condition no current flows through the protection element so that its input signal is not unfavourably influenced.

If the voltage at the input line 61 increases, the electrical field strength will increase in a depletion region around the pn junction 86. When the voltage has increased to such a value that the breakdown voltage of the pn junction 86 is exceeded, avalanche breakdown occurs. The consequence is a comparatively large (hole) current from the active zone 81 to the substrate 10. The breakdown voltage of the pn junction 86 thus constitutes a threshold value of the protection element 8 and in this example has a value of about 10 to 15 V.

Figure 4:
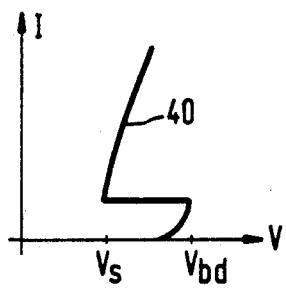
FIG. 4 shows the relation between the current through the protection element and the voltage across the protection element of FIG. 3.

As a result of the injection of holes into the substrate 10, the potential in the part 83 of the substrate 10 between the active zones 81 and 82 can increase to such a value that also the pn junction 87 with the second active zone 82 becomes conducting. From the second active zone 82, electrons are then injected into the substrate part 83, which leads to a parasitic bipolar transistor effect, in which event the first active zone 81, the substrate part 83 and the second active zone 82 can be considered as collector, base and emitter, respectively, of the effectively parasitic bipolar transistor. As a result, the voltage across the first pn junction 86 decreases to the so-called sustaining voltage, which in this example is about 8 V. The voltage at the input line 61 is consequently limited to a lower voltage than the breakdown voltage of the first pn junction 86. In this condition (designated sometimes as "snap-back mode"), the protection element provides for a good conducting current path to the second contact area 7. For a further explanation thereof, reference is made to "A. Ochoa et al, I.E.-.E.E. Transactions on Nuclear Science, Vol. NS-30, pp. 4127-4130, Dec. 1983". The relation between the current strength through the element and the voltage acrosuk is shown diagrammatically in FIG. 4 by a curve 40. In this Figure, the current strength I is plotted on the ordinate and the voltage V is plotted on the abscissa. The breakdown voltage of the pn junction 86 and the sustaining voltage are indicated on the abscissa by $V_{bd}$ and $V_s$, respectively.

As already stated in a preceding paragraph, the active zones 81 and 82 of the protection element are covered with titanium silicide. The use of metal silicides generally has great advantages. As such the low resistivity may be mentioned. However, it has been found that the use of metal silicides in protection elements may lead to disadvantageous consequences. For example, it has been demonstrated that a protection element of the kind described above, in which the active zones 81, 82 are first covered with metal silicides before the electrodes 16 are provided, is considerably less reliable than a similar protection element in which the electrodes 16 are directly located on the active zones 81, 82. It has been found that the first projection element was destroyed at a considerably lower voltage current strength or after a considerably smaller number of electrostatic discharges than the last protection element.

A simple solution for this problem seems to consist in that metal silicide in the protection element is omitted. However, the protection element is preferably manufactured, as will be clear, by the same processing steps as the remaining part of the semiconductor device, in which the use of metal silicide is just desired. At least an additional masking step will often be required when the silicide layer in the protection element is omitted.

DESCRIPTION OF THE INVENTION

Figure 5:
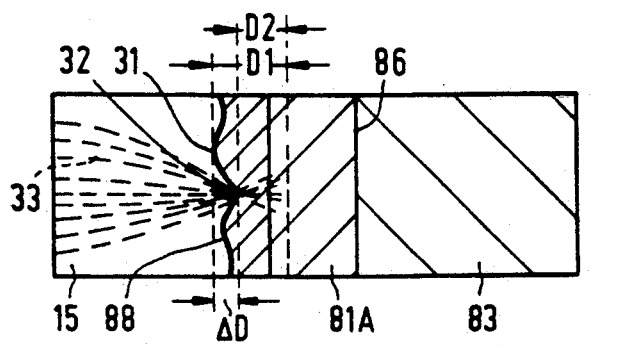
FIG. 5 shows a sectional view parallel to the surface of the protection element of FIG. 3.

With the use of the invention, the disadvantage inherent in the use of metal silicide in protection elements is avoided without additional processing steps being required. The invention is based on the recognition of the fact that the transition 88 from metal silicide 15 to silicon 81 can be fairly irregular and that the reduced reliability of a protection element in which metal silicide 15 is used may be due to local resistance variations as a result of irregularities in the silicide-silicon transition 88. In FIG. 5, a part of the protection element 8 of FIG. 3 is shown for illustration in a sectional view of the titanium silicide 15. Due to the irregularities in the transition 88 from the titanium silicide 15 to the silicon of the active zone 81, the silicide 15 extends at certain areas 31 over a smaller distance an at other areas 32. If e electric current should leave the silicide 15 at an area 31 at which the silicide 15 extends over a relatively short distance into the active zone 81, the current still has to cover a distance $D_1$ in the active zone 81, which in comparison with the silicide 15 is comparatively highohmic, to reach the depletion region around the pn junction 86. However, if the current should leave the silicide 15 at an area 32 at which the silicide extends over a comparatively large distance into the active zone 81, the current need cover only a distance $D_2$ in the active zone 81. Due to the difference in length D of the current path in the active zone 81, the resistance to the pn junction 86 can be considerably lower at the area 32 than the area 31. It is presumed that in a protection element whose active zone 81 is covered with a silicide layer, the current converges to such areas 32 with a comparatively low resistance. As a result, only a small part of the pn junction 86 is used effectively, which locally leads to a strongly increased current density. This variation of the current is indicated in the Figure diagrammatically by dotted lines 33. If the current density exceeds a given maximum, the pn junction 86 can be irreparably damaged, for example, due to the fact that then such a quantity of heat is locally dissipated that the semiconductor material is shortcircuited in the pn junction 86 by fusion. This means that the maximum current that can safely flow through the protection element 8 will be smaller if such a convergence occurs than if the current is distributed practically uniformly over the pn junction 86.

DESCRIPTION OF THE PREFERRED EMBODIMENTS

Figure 6:
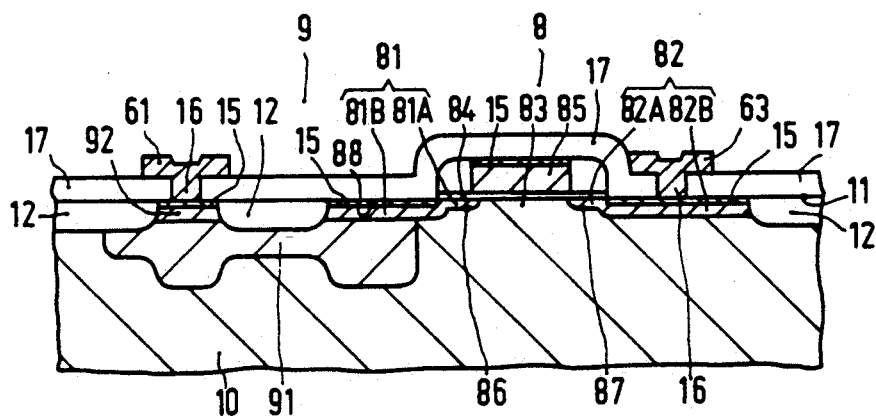
FIG. 6 shows a cross-section of a first embodiment of a semiconductor device according to the invention.
Figure 7A:
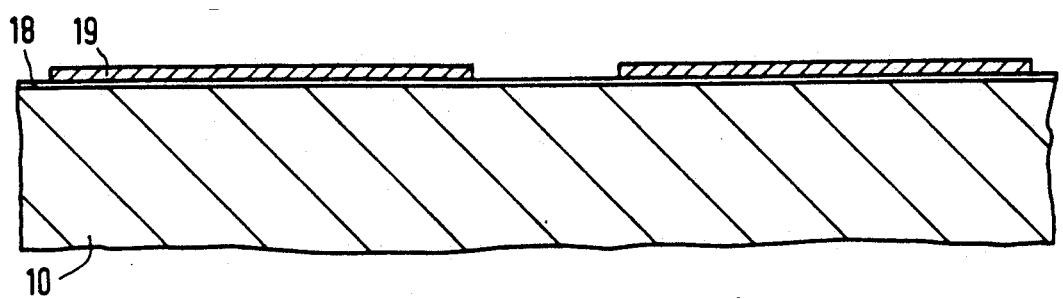
FIGS. 7A, 7B, 8A, 8B, 9A, 9B, 10A, 10B, 11A, 11B, 12A, 12B, 13A and 13B show in cross-section the semiconductor device of FIG. 6 at successive stages of manufacture.
Figure 7B:
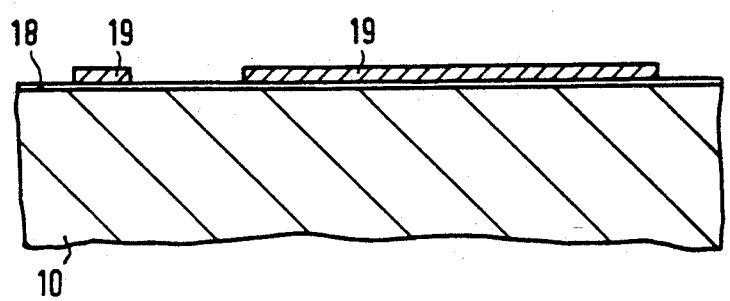
Figure 8A:
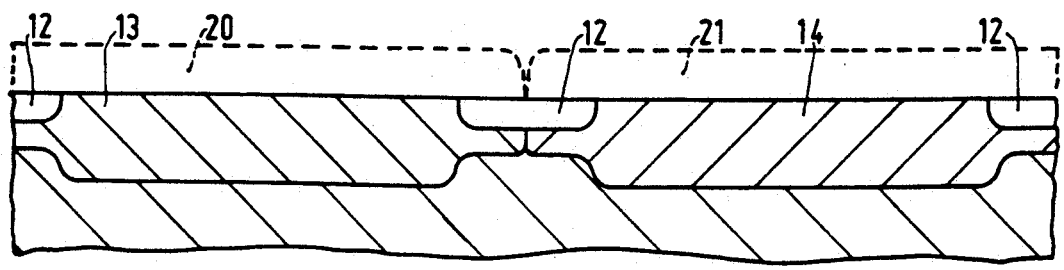
Figure 8B:
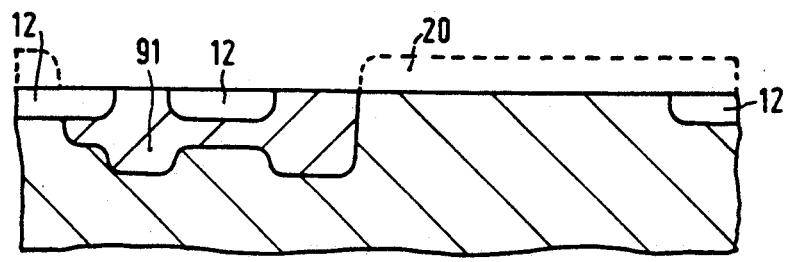

According to the invention, in order to improve the uniformity of the current distribution over the pn junction 86, a resistance element is connected in series with the protection element between the electrode 16 to which the active zone 81 is connected and the pn junction 86 (cf. FIG. 6). In this embodiment, the resistance element 9 comprises an n-type resistance zone 91, which is located in the substrate 10 and whose width according to the invention is practically equal to the width of the active zone 81. The resistance zone 91 is doped with phosphorus in a concentration of about $5 \times 10^{16}$ cm$^{-3}$, which corresponds to a sheet resistance of about 1500 Q/□. According to the invention, the resistance element 9 directly contacts the active zone 81, which is achieved in this case since the resistance zone 91 adjoins the active zone 81 of the protection element. The resistance zone 91 is located for the major part under the sunken silicon oxide layer 12. In an opening in the oxide layer 12, the resistance layer 91 is locally doped somewhat more highly in order to form an electrode region 92. The electrode region 92 is covered with a layer of titanium silicide 15, on which the electrode 16 is provided.

Due to the fact that the resistance zone 91 is connected according to the invention between the electrode 16 and the pn junction 86 in series with the protection element, the overall resistance to the pn junction 86 is increased, as a result of which resistance variations exert relatively less influence. Consequently, it is avoided that the current converges in the low-ohmic electrode 16. The current remains substantially uniform also in the resistance zone 91; and convergence of the current is counteracted by the comparatively high sheet resistance of the zone 91. The current will therefore leave the resistance zone 91 practically uniformly throughout its width. Because the width of the resistance zone 91 is substantially equal to the width of the active zone 81, the current is thus supplied practically uniformly to the active zone 81. The occurrence of convergence of the current between the end of the resistance zone 91 and the active zone 81 is then counteracted by causing the resistance zone 91 to adjoin the active zone 81. When the current has once reached the active zone 81, it can flow along two paths to the pn junction 86. A first path extends more or less directly through the active zone 81 to the pn junction 86; another path extends from the resistance zone 91 through the active zone 81 to the silicide 15 and via the titanium silicide 15 further to the pn junction 86. If the pn junction 86 is located at a comparatively great distance from the sunken oxide layer 12, the current will mainly flow through the good conducting silicide 15. However, according to the pn junction 86 being located more closely to the oxide layer 12, the current is more liable to choose the first path and to flow directly through the active zone 81 to the pn junction 86. This means that this part of the current does not pass the irregular silicide-silicon transition 88 and therefore can no longer be influenced thereby. Especially if the active zone 81 is comparatively short, in this manner a practically homogeneous current distribution over the pn junction 86 can be attained. Preferably, the active zone 81 is therefore chosen within lithographic limits to be as short as possible. In this case, the length of the active zone 81 is about 2 μm.

By the use of the invention, convergence of the current to given areas of the pn junction 86 can be strongly reduced or can even practically completely suppressed. Due to this more uniform current distribution over the pn junction 86, the maximum current that can safely flow through the element can be considerably larger than in the known protection element.

Also with other metal silicides, such as, for example, cobalt, platinum and tungsten silicide, the transition to the subjacent silicon is comparatively irregular, which gives rise in the protection element to similar problems as titanium silicide. Also in these cases, the invention can be used advantageously.

Due to this high degree of conformity with the n-channel transistor 4 of the circuit 1, no deviating or additional processing steps are required for the implantation of the present protection element 8. Also the resistance zone 91 can be adapted so that it is completely compatible with the process of manufacturing the remaining part of the semiconductor device. This will be explained more fully with reference to FIGS. 7A to 13B, in which the first embodiment of the semiconductor device according to the invention is shown in cross-section at successive stages of manufacture.

The Figures with the suffix "A" show the inverter 6 at successive stages of manufacture and the Figures with the suffix "B" show the protection element 8 and the resistance element 9 at the same stages of manufacture.

The starting material (see FIGS. 7A, B) is a p-type silicon substrate 10, which is doped with boron in a density of about $10^{15}$ cm$^{-3}$. The substrate 10 is thermally oxidized for a short time in order to grow a thin layer of silicon oxide 18 on the surface. The silicon oxide layer 18 is then covered with a silicon nitride layer 19, which is patterned by masking and etching.

The assembly is now subjected to an oxidizing medium, as a result of which the parts of the substrate 10 not covered with the nitride layer 19 are oxidized. At these areas, the silicon oxide layer 12 partly sunken into the substrate 10 is formed. The assembly is then covered with a photoresist layer 20, which is locally exposed and is removed by development at the area of the n-well 14 to be formed from the p-channel transistor 5 and the resistance zone 91 to be formed. Subsequently, phosphorus is implanted at a dose of about $5 \times 10^{12}$ cm$^{-2}$ and an energy of about 600 keV, the photoresist layer 20 masking against the implantation. As a result, at the area of the transistor 5 the n-well 14 is formed and at the area of the resistance element 9 the resistance zone 91 is formed. The photoresist layer 20 is now removed, after which a second photoresist layer 21 is provided. The second photoresist layer is removed at the area of the p-well 13 to be formed from the n-channel transistor 4, after which boron is implanted into the substrate. For this implantation, for example, a dose of about $5 \times 10^{12}$ cm$^{-2}$ and an energy of about 250 keV may be used. At the area of the n-channel transistor 4, the p-well 13 is then formed. The second photoresist layer 21 and the nitride layer 19 are now removed and the assembly is planarized in usual manner, the part of the oxide layer 12 not sunken into the substrate 10 being removed and a practically flat structure being obtained (cf. FIGS. 8A, B). In these Figures, a dotted line indicates where the photoresist layers 20, 21 have been located.

Figure 9A:
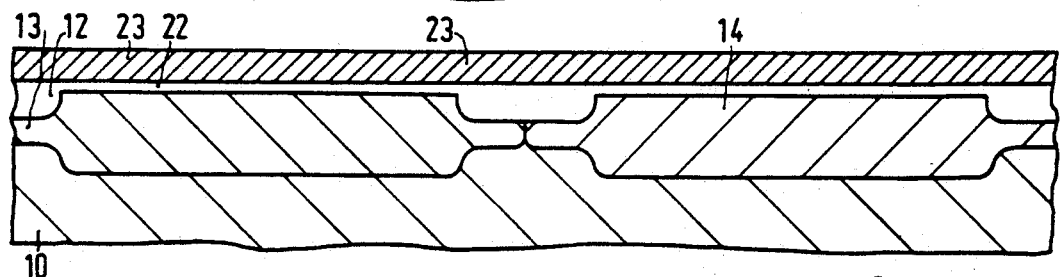
Figure 9B:
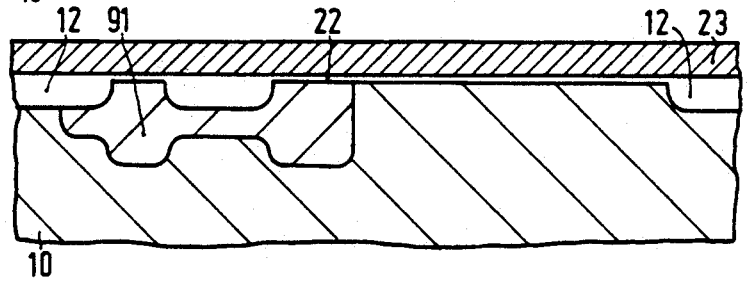
Figure 10A:
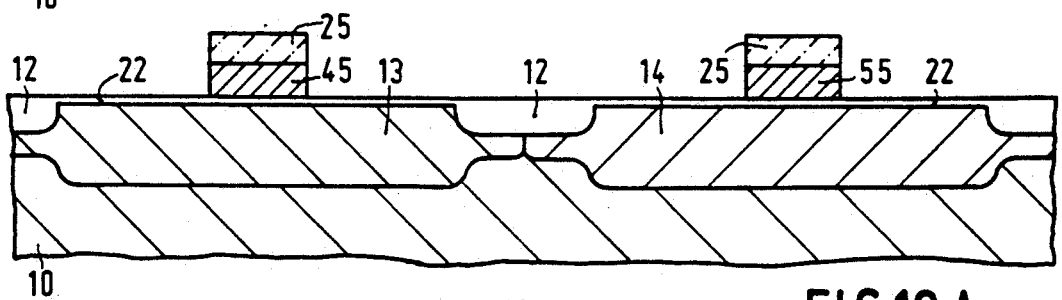
Figure 10B:
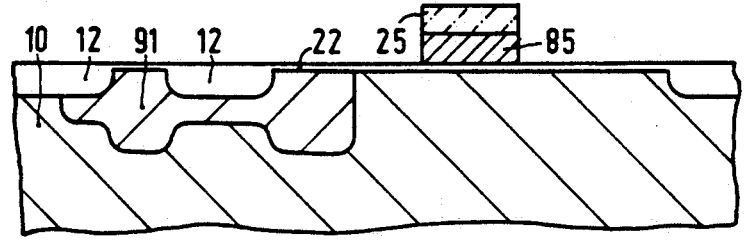

Subsequently, an about 17.5 nm thick oxide layer 22 is thermally grown (cf. FIGS. 9A, B). The oxide layer 22 can be used as gate dielectric. For this purpose, of course also other insulating materials may be used. An about 300 nm thick polycrystalline silicon layer 23 is then provided on the oxide layer 22. The polycrystalline silicon layer 23 is then rendered n-type conducting b means of a phosphorus implantation at a dose of about $5 \times 10^{15}$ cm$^{-2}$. By subjecting the assembly to a thermal treatment, the implanted phosphorus is distributed homogeneous over the polycrystalline silicon layer.

Gate electrodes 45, 55, 85 are formed from the silicon layer 23 for the two transistors 4, 5 and the protection element 8. For this purpose, the silicon layer 23 is provided with an etching mask 25 of photoresist (cf. FIGS. 10A, B). The silicon layer 3 can now be brought by means of a suitable etching process into a pattern which comprises the gate electrodes 45, 55, 85. Subsequently, the etching mask 25 is removed.

At the area of the p-channel transistor 5 to be formed, the surface is covered with an etching mask, which leaves the surface uncovered at the area at which the resistance zone 91 is located and at the area at which the protection element 8 and the n-channel transistor 4 are to be formed. The edges of the mask may be located on the sunken oxide layer 12. Subsequently, phosphorus is implanted, besides the implantation mask the gate electrodes 45, 85 then also masking against the implantation.

Figure 11A:
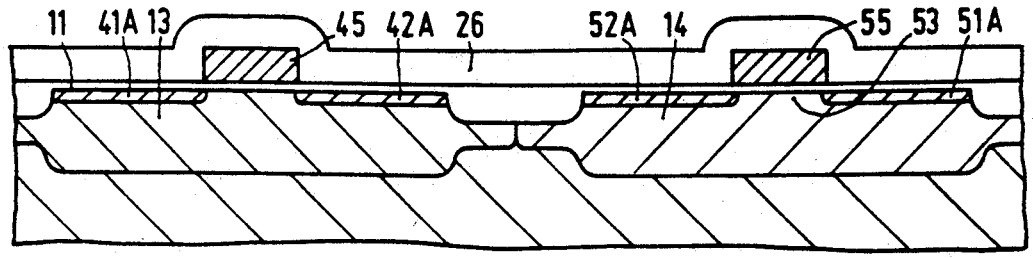
Figure 11B:
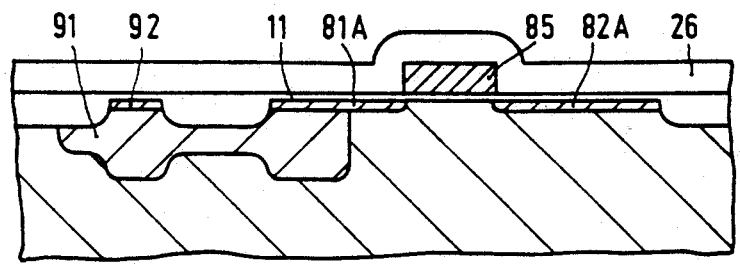
Figure 12A:
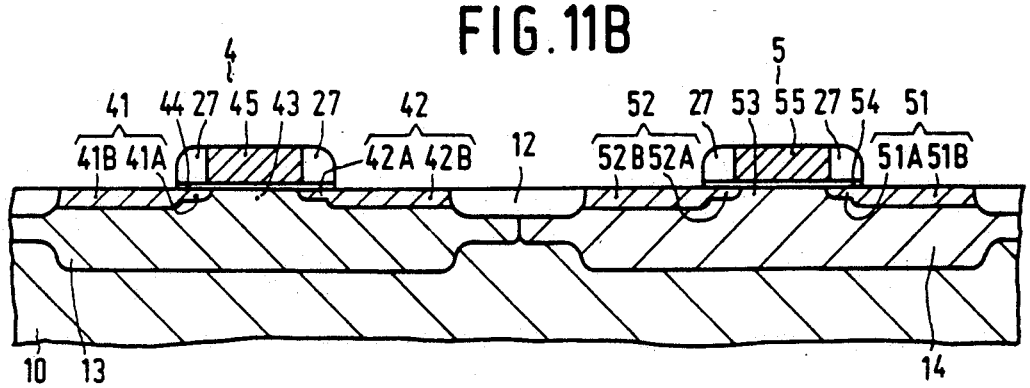
Figure 12B:
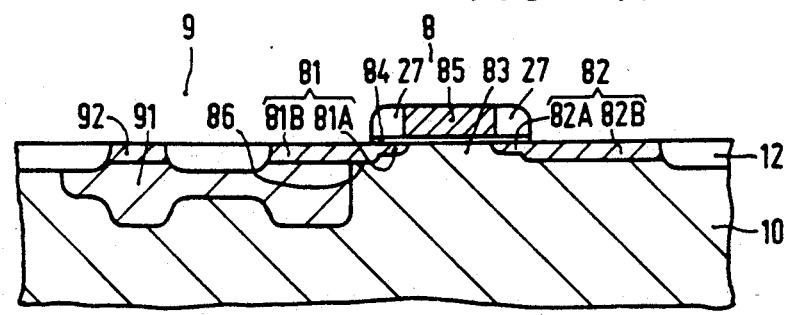
Figure 13A:
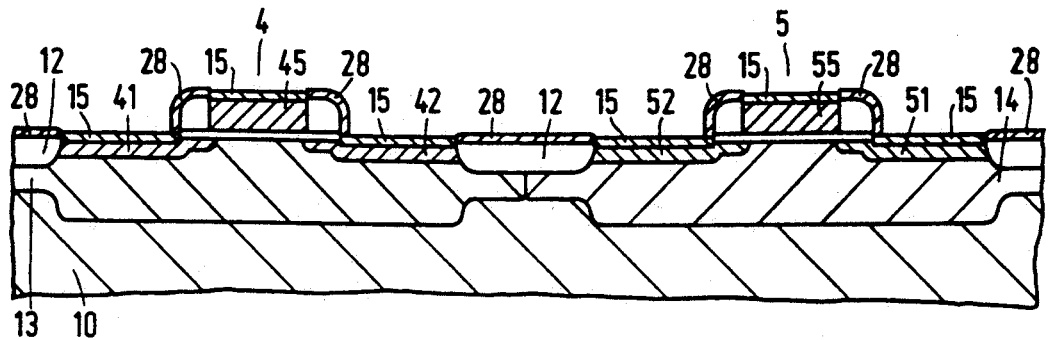
Figure 13B:
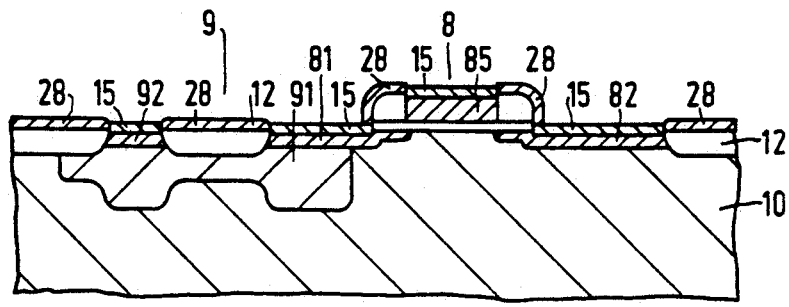

In this self-registered manner for the major part, comparatively weakly doped surface zones 41A, 42A, 81A, 82A are formed, which are mutually separated by the part 43, 83 of the p-well 13 and of the substrate 10, respectively. Moreover, by this implantation, at the surface the doping concentration in the resistance zone 91 is locally increased for forming a contact zone 92. The implantation can be carried out at a dose of about $4 \times 10^{13}$ cm$^{-2}$ and an energy of about 50 keV. After the implantation mask has been removed, a second complementary implantation mask is provided, which leaves the surface 11 uncovered at the area of the n-channel transistor 5 to be formed. Subsequently, in an analogous manner, boron can be implanted into the n-well 14 for forming comparatively weakly doped p-type surface zones 51A, 52A. As a result, a dose of about $4 \times 10^{13}$ cm$^{-2}$ and an energy of about 25 keV are used. After the second implantation mask has also been removed, the assembly is covered with an about 0.25 μm thick layer of silicon oxide 26, for example deposition from the gaseous phase of a TEOS atmosphere. The implanted impurity in the surface zones can than diffuse further into the substrate 10. The structure now obtained is shown in FIGS. 11A, B.

The silicon oxide layer 26 is then etched away anisotropically together with the subjacent silicon oxide layer 22. Of the silicon oxide layer 26, only edge portions 27 (spacers) are then left (cf. FIGS. 12A, B). The parts 44, 54, 84 left of the silicon oxide layer 22 are used as gate dielectrics for the gate electrodes 45, 55, 85 of both transistors 4, 5 and the protection element 8.

The edge portions 27 are used beside the gate electrodes for masking in the subsequent implantations, in which boron is implanted into the n-well 14 and arsenic is implanted into the p-well 13 and at the area of the protection element 8 to be formed into the substrate 10. The edge portions 27 now also mask against the implantation and a higher dose and a higher energy are used than in the preceding implantations. As a result, surface zones 41B, 42B 81B, 82B located slightly more deeply can be formed and are doped comparatively highly as compared with the weakly doped surface zones 41A, 42A, 81A, 82A (cf. FIGS. 12A, B). For these boron and arsenic implantations a dose of about $3 \times 10^{15}$ cm$^{-2}$ is used. Arsenic is then also implanted into the resistance zone 91 in order to further increase the doping concentration in the surface zone 92.

The assembly is then covered with a metal layer 28 by sputtering titanium over the whole surface. Another metal, such as, for example, cobalt or platinum, may also be used. The assembly is then heated to a temperature of about 650° C. with the titanium 28 reacting with silicon to form titanium silicide 15 at areas at which the titanium 15 is directly in contact with silicon. Thus, the gate electrodes 45, 55, 85, the source 41, 51 and the drain 42, 52, the first active zone 81 and the second active zone 82 as well as the contact zone 92 are provided in a self-registered manner with a good conducting top layer of titanium silicide 15 (cf. FIGS. 13A, B). The remaining non-converted titanium 28 can be selectively removed by means of suitable solvent with respect to the titanium silicide 15. For the sake of clarity, it should be noted here that, when in the present application the term "titanium silicide" or in a more general sense the term "metal silicide" is used, this term is to be understood to mean not only a stoichiometric compound, but in a more general sense any material containing metal as well as silicide.

The assembly is then covered with a silicon oxide layer 17, in which contact windows are provided above the metal silicide parts 15. In the contact windows, the metal silicide 15 is covered with a thin layer of titanium-tungsten (not shown), after which the assembly is provided with a layer of aluminium, which is located in the contact windows on the metal silicide and thus forms electrodes 16. From the aluminum layer, the desired wiring, among which the connection conductors 61–64, is then formed by masking and etching. The structure now obtained is shown diagrammatically in FIGS. 2 and 6.

Figure 14:
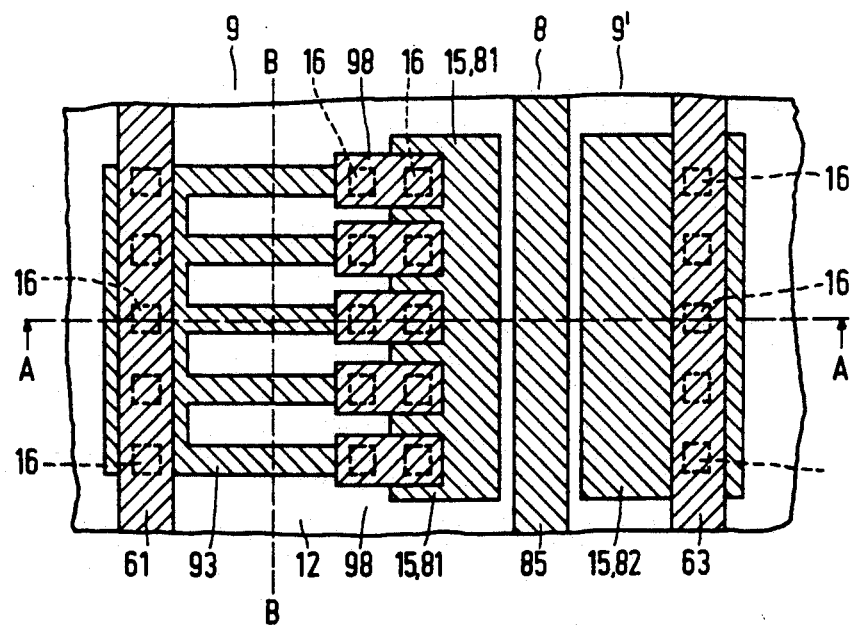
FIG. 14 is a plan view of a second embodiment of a semiconductor device according to the invention.
Figure 15A:
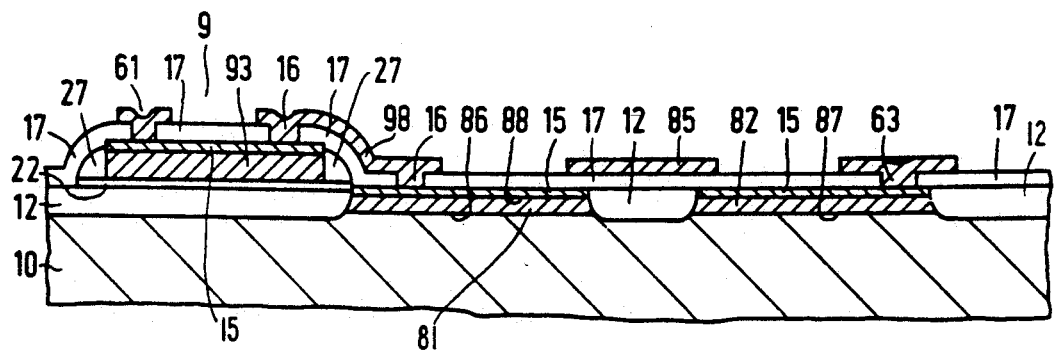
Figure 15B:
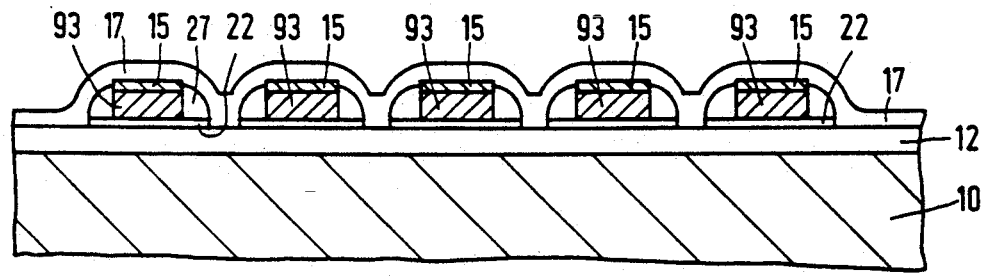
FIG. 15B shows a cross-section taken on the line B—B in FIG. 14.
Figure 16A:
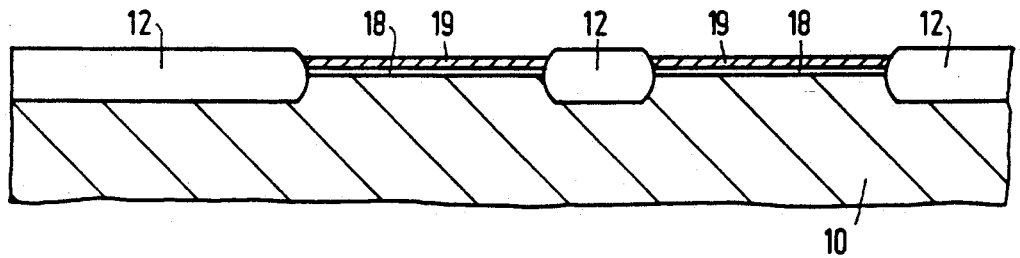
Figure 16B:
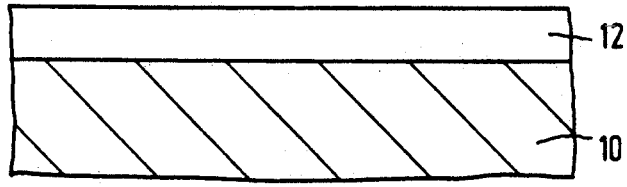

A second embodiment of the semiconductor device according to the invention is shown in plan view in FIG. 14 and in cross-section in FIGS. 15A and 15B. In this embodiment and also in the following embodiments, the CMOS circuit described above is always started from. For a description thereof, reference is therefore made to the first embodiment.

As in the preceding embodiment, the protection element comprises a first active zone 81 and a second active zone 82, which are both of the n-type. Both zones 81, 82 form a pn junction 86, 87 with the adjoining part of the p-type substrate 10 and are covered at their surface with titanium silicide 15. In this embodiment, the substrate 10 is located between the two active zones 81, 82 under an about 0.4 μm thick silicon oxide layer 12, which is sunken into the substrate 10. The sunken oxide layer 12 is covered successively with a second silicon oxide layer 17 and an aluminium gate electrode 85. Both oxide layers 12, 17 together constitute a comparatively thick gate dielectric, as a result of which the threshold voltage of the protection element as MOS transistor is comparatively high.

If the voltage across the protection element exceeds the threshold voltage of about 15–20 V, the protection element 8 reaches the "snap-back" condition described above. An electrical connection then exists from the input line 61 via the protection element to the second supply line 63. Due to the comparatively large thickness of the gate dielectric, the protection element of this embodiment is comparatively strong. Moreover, also the distance between the active zones 81, 82 is chosen to be greater than in the preceding embodiment, which altogether results in that the protection element described here is capable of withstanding comparatively high voltages. The element proved to be capable of withstanding voltages higher than 1000 V, applied according to the so-called "Human Body Model"; US.-Milt.Std. 883C, Method 3015.6, Notice 7. On the contrary, the protection element described here is slower than the element of the preceding embodiment due to its higher threshold value. Preferably, in the semiconductor device both protection elements are therefore separately connected along the input line 61 and the second supply line 63 so that the advantages of both elements can be utilized. In the case of an electrostatic discharge, the voltage is limited sufficiently rapidly to a safe value by the protection element of the first embodiment, while the protection element described here ensures that the charge can be dissipated in a sufficiently high density.

The resistance element 9, which according to the invention is connected in series with the protection element 8, comprises in this embodiment a phosphorus-doped polycrystalline silicon layer covered with a top layer of titanium silicide 15, which polycrystalline silicon layer is partly subdivided into strips 93. The composition and the thickness of the polycrystalline silicon layer are substantially equal to those of the gate electrode of the inverter of the integrated circuit so that the resistance element can be provided together with it in the same processing steps. The resistance of the resistance element 9 is mainly determined by the good conducting top layer 15 of titanium silicide. The sheet resistance is consequently about 3–4 Ω/□. In principle, other conductive materials may also be used for the resistance element, but this will often require additional processing steps.

Due to the fact that the resistance element 9 is subdivided into separate strips 93, which are insulated from the substrate by means of the oxide layers 12, 22, the current convergence described above is counteracted in the resistance element. The strips 93 are located at a relative separation distance of about 4 μm and have a width of about 1 μm. With a length of 5–20 μm, this leads to a resistance of about 15–80 Ω per strip. Due to the fact that the strips are connected in parallel, however, the resistance of the resistance element is comparatively low so that the latter substantially does not influence the switching speed of the protection element. On the side remote from the active zone 81, the resistance element 9 is not subdivided into strips and a number of electrodes 16 are provided on the element, which, although not visible in plan view, are indicated by dotted lines in FIG. 14. Via the electrodes 16, the resistance element 9 is connected to the input line 61. In this part of the resistance element 9, resistance fluctuations at the transition from the titanium silicide 15 to the active zone 81 are not or substantially not noticeable due to the comparatively high resistance of the separate strips 93. Convergence of an electric current will therefore not or substantially not occur in this case, so that the current is supplied substantially uniformly to the resistance element. In the resistance element 9, convergence is not possible due to the fact that the strips 93 are laterally insulated from each other. The current will therefore leave the element substantially with the same uniformity. On the side facing the protection element 8, the strips 93 are each individually connected via an aluminium strip 98 to the active zone 81. By using separate aluminium parts 98 instead of a common continuous aluminium layer for the connection of the strips 93 with the active zone 81, convergence of the current in the low-ohmic aluminium 98 is counteracted. The current will thus be supplied substantially uniformly to the titanium silicide 15 on the active zone 81. When the path of the current in the silicide 15 is not too long, a substantially homogeneous current distribution can thus be obtained over the pn junction 86.

It should be noted that, although in this embodiment the resistance element 9 is connected through separate aluminium strips to the active zone 81, this connection should nevertheless be considered as direct within the scope of the invention, in contrast with a connection by means of an aluminium layer extending in the transverse direction.

With reference to FIGS. 16 to 19, the manufacture of the second embodiment will be described. The Figures now show the protection element 8 and the resistance element 9 at successive stages of manufacture. The CMOS circuit is formed in the same manner as described above with reference to the first embodiment.

The starting material is a boron-doped p-type substrate 10, on which an oxide mask of silicon nitride 19 is provided. Between the mask 19 and the substrate 10, a thin layer of silicon oxide 18 is provided for neutralizing stress. For this purpose, silicon oxynitride may also be used. Subsequently, the assembly is thermally oxidized, a silicon oxide layer 12 partly sunken into the substrate is grown on the unmasked part of the substrate (cf. FIGS. 16A and 16B).

The p- and n-wells for the CMOS circuit can now be provided. Neither the protection element 8 nor the resistance element 9 comprises in this embodiment such a well. Both elements 8, 9 are consequently also compatible with processes in which such a well is not present, such as, for example, an NMOS or a PMOS process.

Figure 17A:
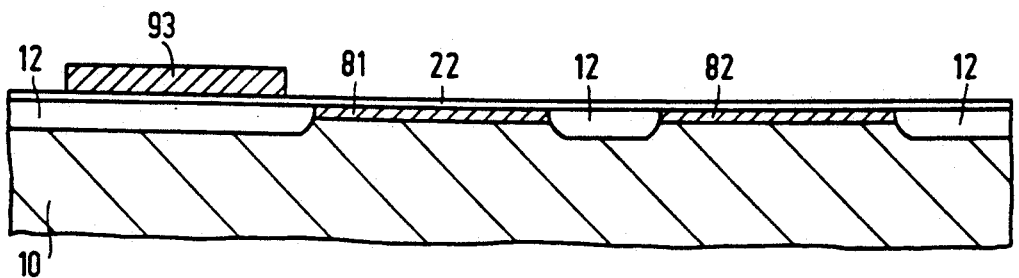
Figure 17B:
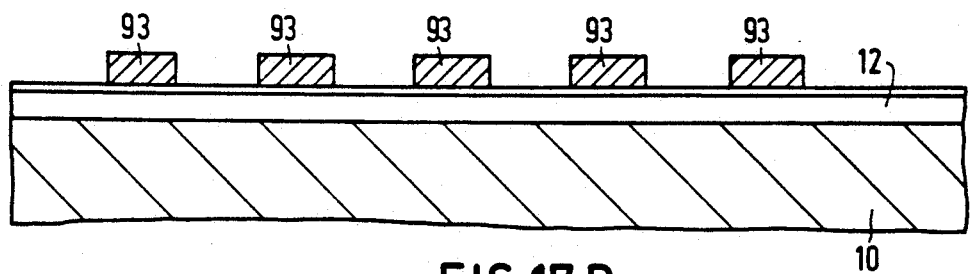

After the oxidation mask 19 has been removed, the oxide layer 12 is planarized in a usual manner so that only the part thereof sunken into the substrate is left. Subsequently, a light thermal oxidation is carried out to form a thin silicon oxide layer 22 of about 17.5 nm, which is used as gate dielectric in the inverter, as is described in the first embodiment. The silicon oxide layer 22 is covered with a layer of polycrystalline silicon, which is doped with phosphorus and from which the strips 93 of the resistance element 9 are formed by masking and etching. From the same silicon layer, the gate electrodes 45, 55 of the CMOS transistors are also formed, which has already been described in the first embodiment, so that no additional processing steps are required for providing the strips 93. The structure now obtained is shown in FIGS. 17A and 17B.

Figure 18A:
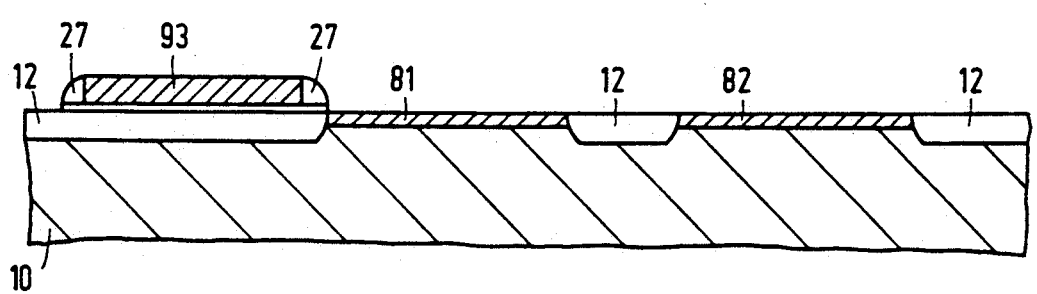
Figure 18B:
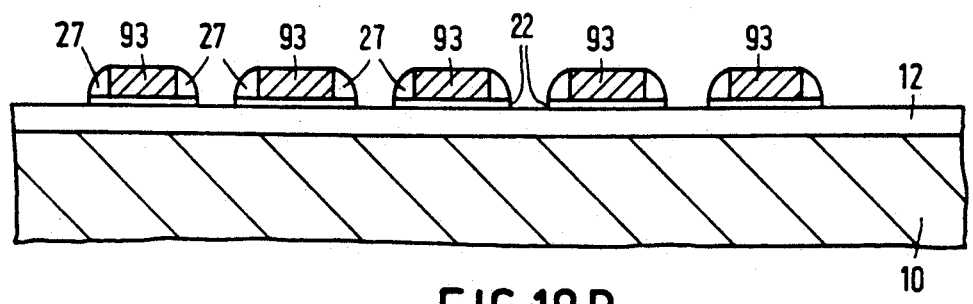
Figure 19A:
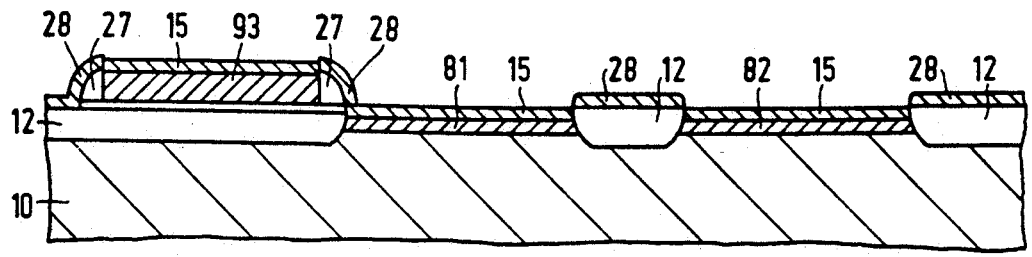
Figure 19B:
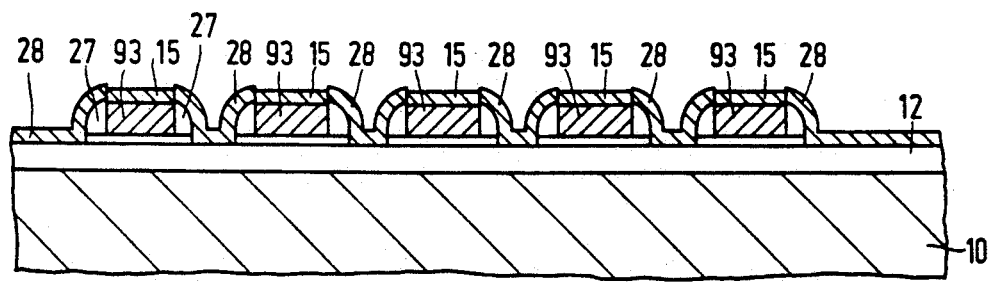

At the area of the protection element, phosphorus and arsenic are now successively implanted into the substrate 10, with comparatively highly doped surface zones 81, 82 being formed on either side of the sunken oxide layer 12. The doping concentration in the zones 81, 82 is about $10^{20}$ cm$^{-3}$. Between the two implantations, the assembly is covered with a thick silicon oxide layer, which is then etched away anisotropically together with the subjacent silicon oxide layer 22 and of which only the edge portions 27 are left along the strips 93. The structure is shown in FIGS. 18A and 18B.

The assembly is now covered with a layer titanium 28, for example by sputtering it onto the surface, and is heated to a temperature of about 675° C. At areas at which the titanium layer 28 is in contact with the silicon, the titanium reacts with the silicon while forming titanium silicide 15 (cf. FIGS. 19A and 19B). Besides the areas at which the titanium layer 28 is in contact with the silicon substrate 10, this is also the case, for example, on the, polycrystalline silicon on the strips 93 and 81, 82. The non-converted titanium can then be selectively removed.

The assembly is then covered with a comparatively thick silicon oxide layer 17, into which contact windows are etched in a usual manner. Subsequently, the assembly is covered with an aluminium layer, from which electrodes 16 and the wiring 61, 63 are formed by masking and etching. In this step, beside the input line 61 and the second supply line 63, also aluminium strips 98 are provided between the strips 93 and the active zone 81 and the second active zone 82, respectively. Moreover, from the aluminium layer a gate electrode 85 for the protection element is formed. The structure obtained is shown in cross-section in FIGS. 15A and 15B.

Figure 20:
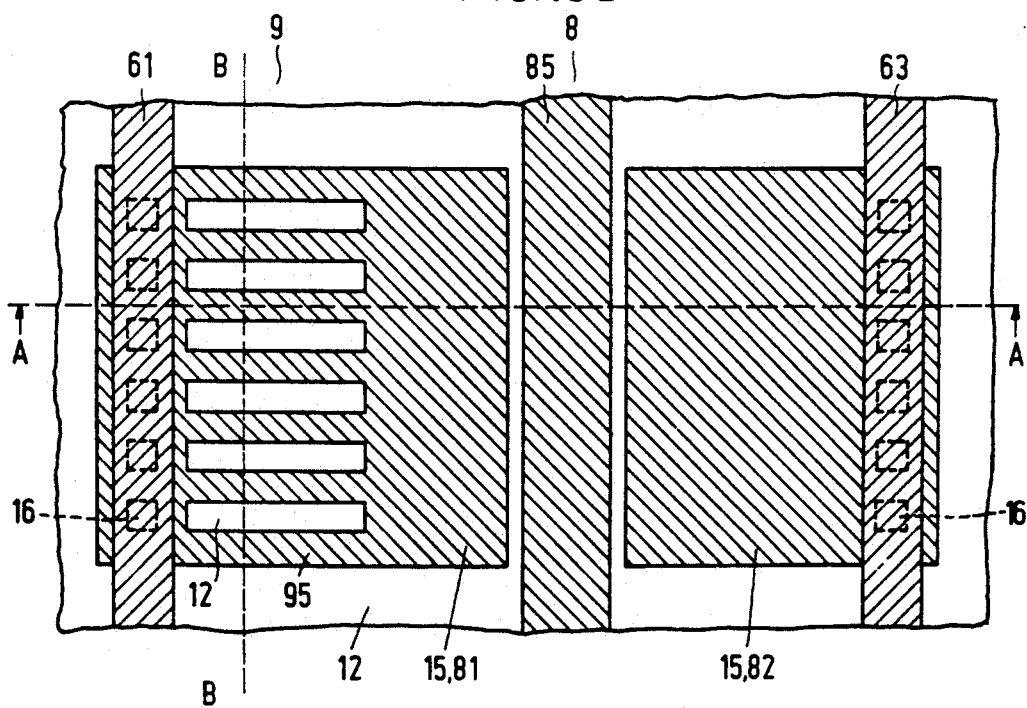
FIG. 20 is a plan view of a third embodiment of a semiconductor device according to the invention.
Figure 21A:
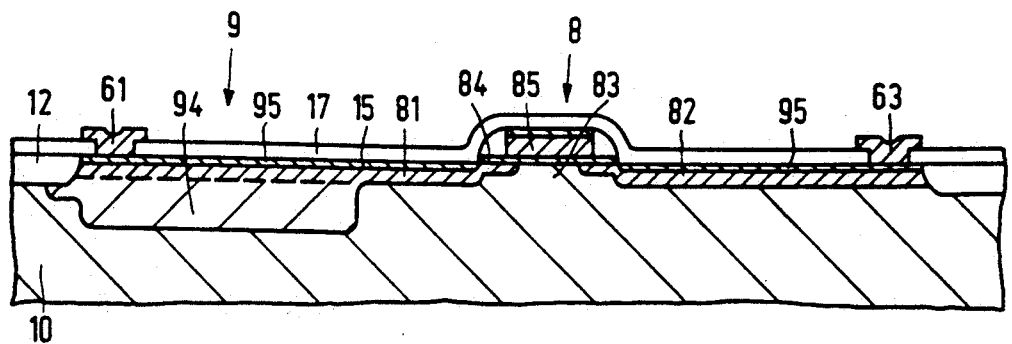
Figure 21B:
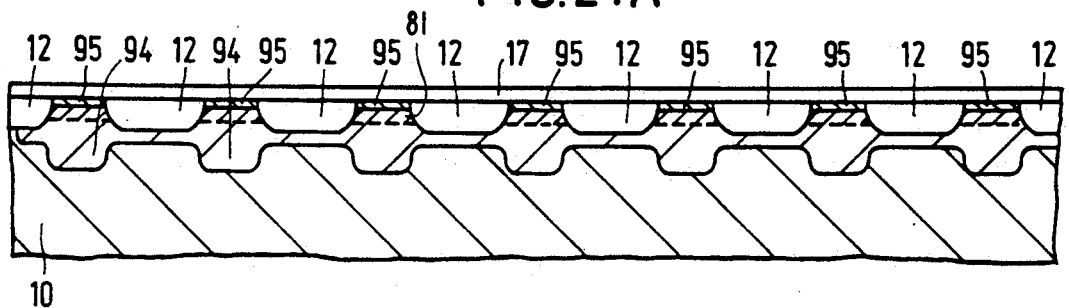
FIG. 21B shows a cross-section taken on the line B—B in FIG. 20.

FIGS. 20 and 21A and 21B show a third embodiment of the semiconductor device according to the invention in plan view and in cross-section, respectively. The device comprises, like in the first embodiment, a CMOS circuit, which otherwise is not essential to the invention and is therefore not shown in the Figures. For a description of the circuit, reference is therefore made here to the first embodiment.

In this third embodiment, the starting material is the same protection element 8 as in the first embodiment. It comprises a first active zone 81 and a second active zone 82, both of the n-type, which are connected to the input line 61 and to the second supply line 63, respectively. The active zones 81, 82 each form a pn junction 86 and 87, respectively, with the adjoining part of the p-type substrate. The part 83 of the substrate 10 between the two active zones 81, 82 is covered with an about 17.5 nm thick gate dielectric of silicon oxide and a gate electrode 85 of n-type polycrystalline silicon. Both the gate electrode 85 and the active zones 81, 82 are covered with titanium silicide 15. otherwise it is to be preferred to connect the gate electrode 85 of the protection element via a resistor to the second supply line. In fact this results in that the voltage between the gate electrode 85 and the second active zone 82 remains low, as a result of which breakdown of the gate dielectric 84 can be prevented when the voltage at the input line 61 assumes a high value.

The resistance element 9 in this embodiment according to the invention comprises an n-type resistance zone 94, on which a number of strips 95 of titanium silicide are disposed, which extend substantially parallel to each other. The strips are about 10 μm long and 1 μm wide. With a sheet resistance of about 3–4 Ω/□ of the titanium silicide 15, consequently the resistance is per strip about 30 Ω. The resistance zone 94 is provided in a p-type part of the substrate 10 and is insulated therefrom by a pn junction. The strips 95 merge into the titanium silicide layer 15 at the active zone 81, which also adjoins the resistance zone 94. On the side remote from the active zone 81, the strips 95 are interconnected and electrodes 16 are provided thereon, by means of which the resistance element 9 is connected to the input line 61. The electrodes 16 are indicated in FIG. 20 by dotted lines, although actually they are not visible in plan view. At the area at which the resistance zone 94 is not covered with the silicide strips 95, the zone 94 is located under the silicon oxide layer 12 sunken into the substrate 10 (cf. FIG. 21B).

Hereinafter the manufacture of the semiconductor device described here will be explained with reference to FIGS. 22 to 25. The Figures show both the resistance element 9, and the protection element 8 at successive stages of manufacture.

Figure 22A:
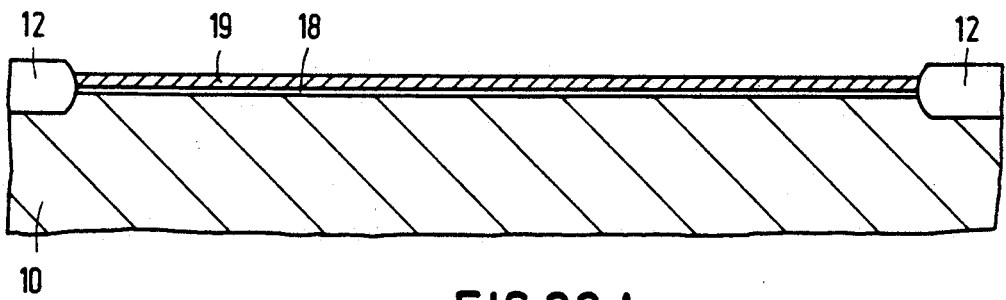
FIGS. 22A, 22B, 23A, 23B, 24A, 24B, 25A and 25B show in cross-section the semiconductor device of FIGS. 21A and 21B at successive stages of manufacture.
Figure 22B:
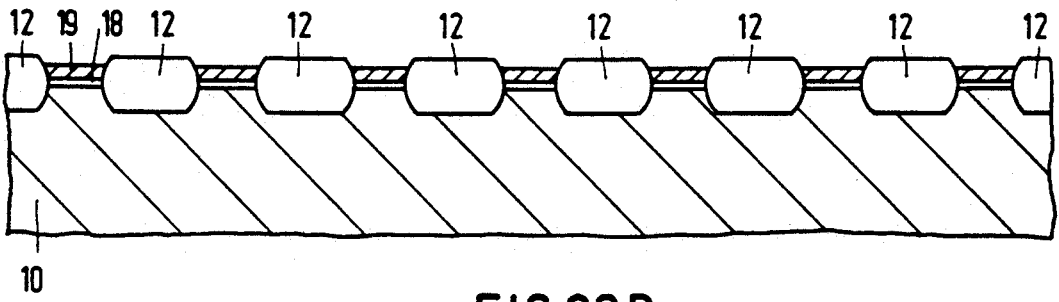

The starting material is a p-type silicon substrate 10, which is covered successively with a thin silicon oxide layer 18 and a silicon nitride layer 19. After the nitride layer 19 has been patterned in a usual manner, the assembly is subjected to an oxidizing medium, as a result of which a partly sunken silicon oxide layer 12 is formed in the parts of the substrate 10 left free of nitride layer 19. It is now ensured that the substrate 10 is covered with the nitride layer 19 at the area where the metal silicide strips 95 of the resistance element have to be later formed. The structure is shown in FIG. 22A and 22B.

Figure 23A:
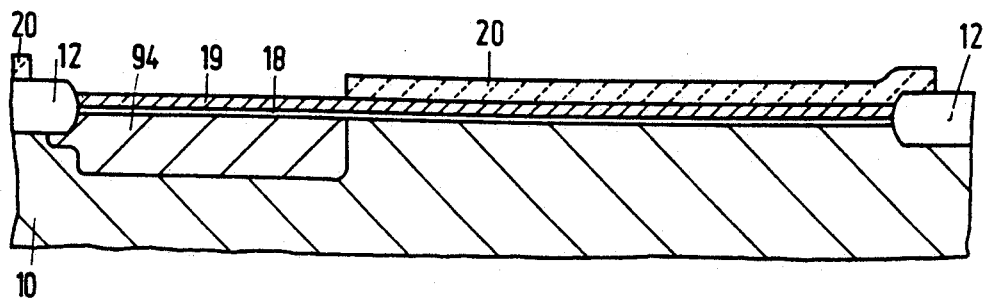
Figure 23B:
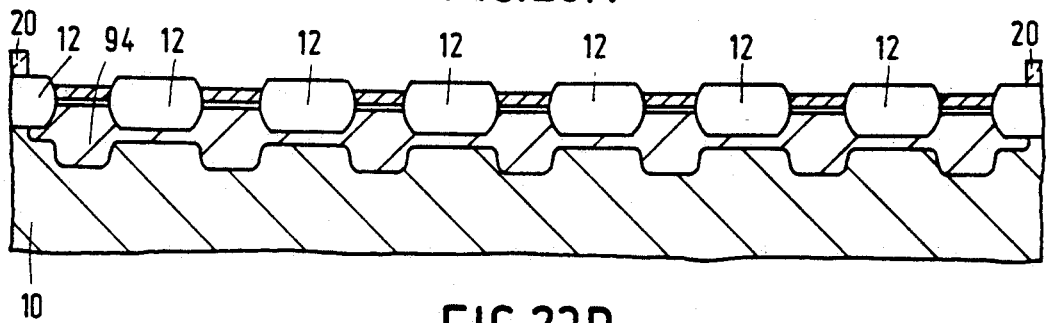
Figure 24A:
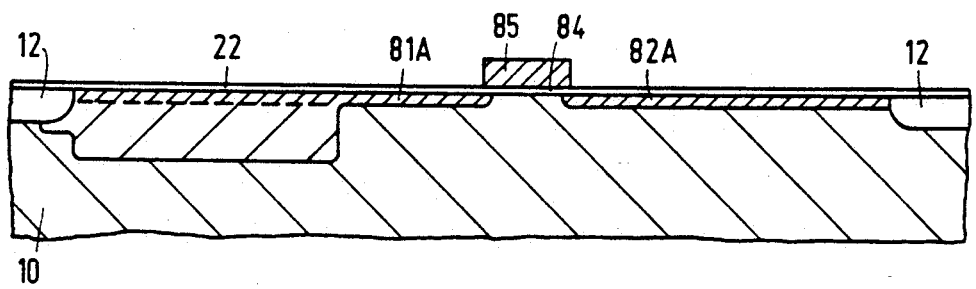
Figure 24B:
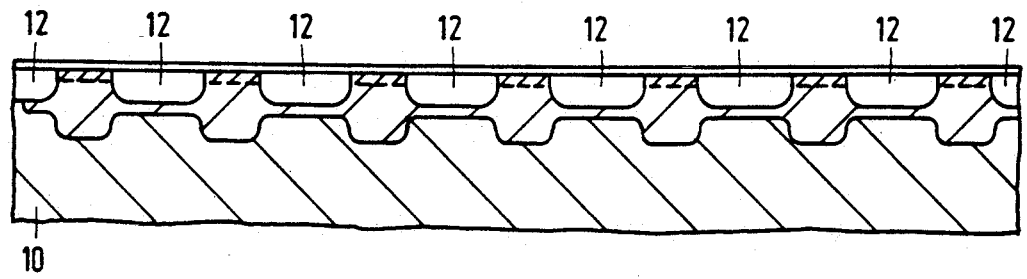
Figure 25A:
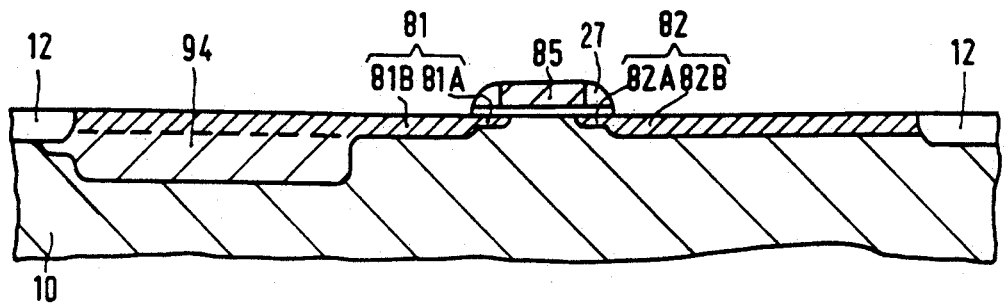
Figure 25B:
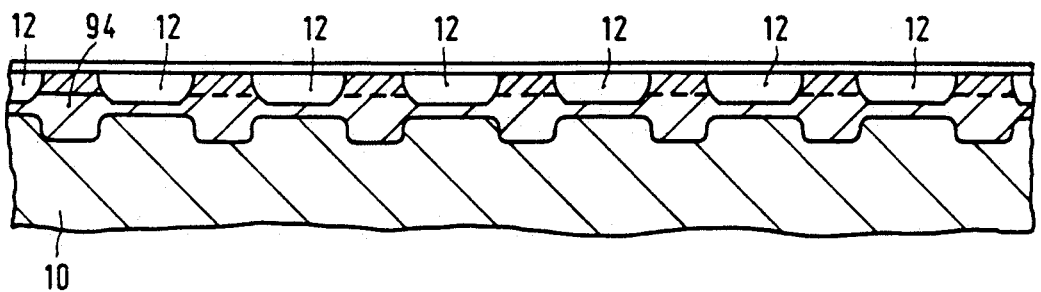

At the area of the protection element to be formed, a photoresist mask 20 is now provided, after which by implantation of phosphorus into the unmasked parts of the substrate 10 an n-well 94 is provided, which constitutes the resistance zone (cf. FIGS. 23A and 23B). After the implantation, the assembly is heated for some time in order to activate the implanted impurity.

After the mask 20 and the nitride layer 19 have been removed, the partly sunken silicon oxide layer 12 is planarized in a usual manner, after which about 17.5 nm thick silicon oxide layer 22 is grown by thermal oxidation, which layer 22 is used as gate dielectric for the protection element. At the area of the protection element, a gate electrode 85 of n-type polycrystalline silicon is provided on the oxide layer 22, after which a first phosphorus implantation is carried out in order to form on either side of the gate electrode 85 comparatively weakly doped and fairly shallow n-type surface zones 81A, 82A (cf. FIGS. 24A and 24B).

The assembly is then covered with a comparatively thick silicon oxide layer, from which edge portions 27 are formed by etching the layer back anisotropically. These edge portions 27 mask in a second arsenic implantation, which is carried out at a higher dose than the preceding implantation. The first implantation is carried out, for example, at a dose of about $4 \times 10^{13}$ cm$^{-2}$, while in the last-mentioned implantation the dose is about $3 \times 10^{15}$ cm$^{-2}$. As a result, somewhat deeper and somewhat more highly doped surface zones 81B, 82B are formed, which are moreover slightly further from the gate electrode 85. The zones 81A and 81B together constitute the first active zone 81 of the protection element. Likewise, the zones 82A and 82B, together constitute the second active zone 82 (cf. FIG. 25A).

Subsequently, the assembly is covered with a layer of titanium, after which by a heat treatment the titanium which is in contact with silicon is converted into titanium silicide 15. The remaining titanium is then etched away, Not only is titanium silicide 15 provided on the first active zone 81 and the second active zone 82, but also the silicide strips 95 of the resistance element 9 are formed in this step. The assembly is then covered with a silicon oxide layer 17, which is provided with contact windows at the area of the resistance element 9. Subsequently, the assembly is covered with a thin titanium-tungsten layer and a layer of aluminium, from which electrodes 16 and the desired wiring, such as the input line 61 and the second supply line 63, are formed by masking and etching (cf. FIGS. 20, 21A and 21B).

In the semiconductor device according to the invention, the resistance element can be accommodated in the device so as to be separated from the protection element. This is the case, for example, in the second embodiment described above. In this case, the resistance element is connected via wiring to the protection element. It is also possible that the resistance element adjoins the protection element, as in the first and third embodiments described above. In this case, a separate wiring for the electrical connection of the resistance element with the protection element may be omitted. A still further integration is attained if in the semiconductor device according to the invention the resistance element is accommodated in the protection element. As an example thereof, a fourth embodiment of the semiconductor device according to the invention will be described below.

Figure 26:
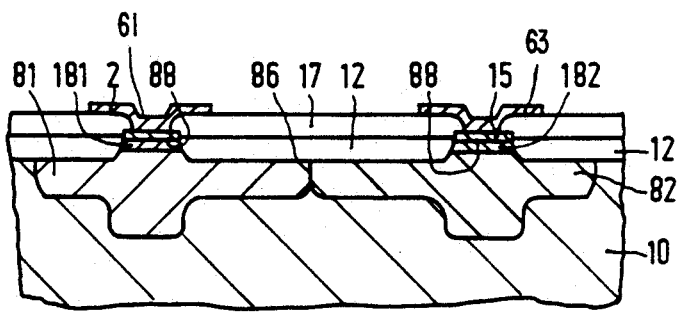
FIG. 26 shows a fourth embodiment of the semiconductor device according to the invention.

FIG. 26 shows in cross-section the protection element according to the fourth embodiment of the semiconductor device. The protection element in this embodiment comprises a first active zone 81 and a second active zone 82 of opposite conductivity types. The active zones 81, 82 constitute a diode having a breakdown voltage of about 35 V. The active zones 81, 82 are provided in the same processing steps as the n-well and the p-well of the p-channel and the n-channel transistor, respectively, of the integrated circuit. The first active zone 81 consequently has a sheet resistance of about 15 k$\Omega$/$\square$, which is amply sufficient to counteract the aforementioned convergence of current.

The first active zone 81 and the second active zone 82 are located in part under a silicon oxide layer 12 which is sunken into the substrate 10 and limits the pn junction 86 between the two zones at the surface. At the area at which the zones 81, 82 are not located under the silicon oxide layer 12, the zones are covered with titanium silicide 15. Both in the first zone 81 and in the second zone 82, an additional quantity of n-type dopant is provided locally at the surface for forming contact zones 181 and 182. For this purpose, use is made of the source and drain implantation for the n-channel transistors in the CMOS circuit. The assembly is covered with a comparatively thick silicon oxide layer 17, in which contact windows are provided at the area of the contact zones 181, 182. In the contact windows, the active zones 81, 82 on the silicide layer 15 are provided with electrodes 16, by means of which the first active zone 81 is connected to the input line 61 and the second active zone 82 is connected to the second supply line 63.

Due to the fact that between the contact zones 181, 182 the first active zone 81 and the second active zone 82 are located under the oxide layer 12 and are not covered with silicide 15, an electric current can reach the pn junction 86 only via the comparatively weakly doped zones. The current thus meets such a resistance that the resistance fluctuations in the silicide-silicon transition 88 no longer have substantially any influence. The current will therefore spread substantially homogeneously over the pn junction 86, as a result of which the maximum current density admissible for the protection element is reached only at a comparatively high overall current.

Figure 27:
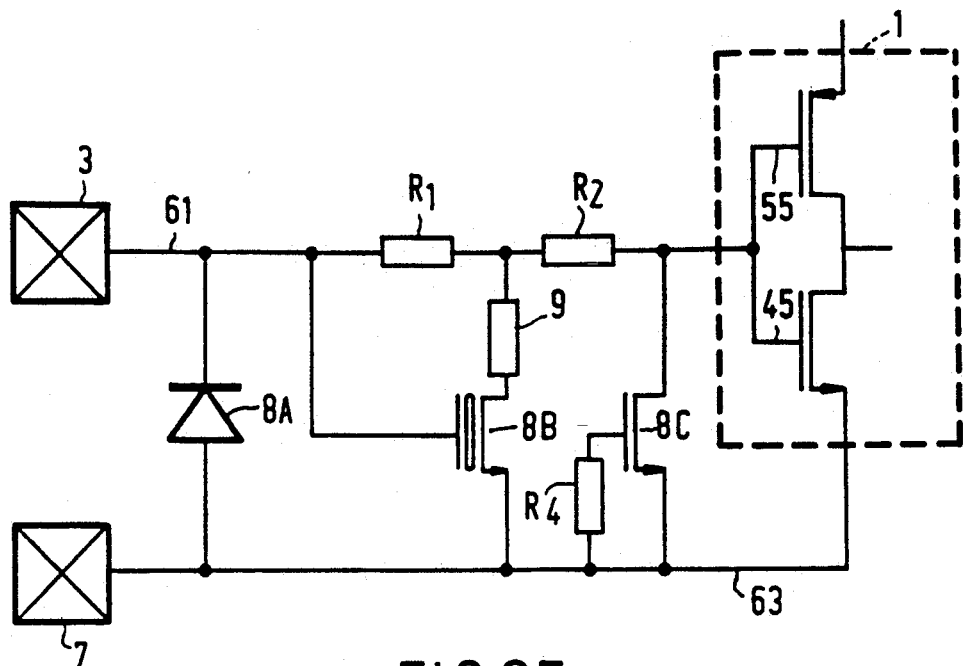
FIG. 27 shows an electric equivalent circuit diagram of a fifth embodiment of a semiconductor device according to the invention.

The breakdown voltage of the pn junction 86 of about 35 V is higher than the threshold voltage of the protection elements of the preceding embodiments. On the contrary, however, the protection element described here has a considerably greater strength as compared with the other protection elements. This means that it is capable of withstanding a considerably higher voltage and current density than the protection element of a preceding embodiment. In a fifth embodiment of the semiconductor device, according to the invention, various embodiments of the protection element are therefore commonly used in a circuit in order to combine the various advantages therein. FIG. 27 shows an electric equivalent circuit diagram thereof.

In this embodiment, three protection elements 8A-C are connected in parallel between the input line 61 and the second supply line 63. The first protection element 8A comprises a p-well/n-well diode of the kind described in the fourth embodiment. The second protection element 8B is composed, like the protection element of the second embodiment, with a comparatively thick gate dielectric and a comparatively great channel length as compared with the third protection element 8C, which is composed in the manner described in the first embodiment. The gate electrode of the second protection element 8B is connected to the input line 61. As a result, with an electrostatic discharge, the gate electrode and the first active zone of the protection element 8B will be applied to practically the same voltage so that the second protection element 8B will become conducting more rapidly. The thick gate dielectric of the second protection element 8B is then sufficiently strong to withstand the voltage between the gate electrode and the second active zone.

Between the section element 8B and the input line 61, according to the invention a resistance element 9 is connected, for which in this case the resistance element of the second embodiment described above is chosen. By the second protection element 8B, the voltage at the input line 61 is limited to a sufficiently low value so that a series resistor for the third protection element 8C is not necessary. Moreover, in the third protection element 8C the voltage at the gate electrode is kept low by means of the resistor $R_4$, which is connected between the gate electrode and the second supply line 63.

Also, between the connections of the first protection element 8A and the second protection element 8B to the input line 61, a series resistor $R_1$ is included in the input line. A series resistor $R_2$ is also connected between the connections of the second and third protection elements 8B, 8C to the input line 61. Preferably, for both series resistors $R_1$, $R_2$ use is made of a resistance zone, which is located in the semiconductor body and forms a pn junction with the adjoining part of the semiconductor body. During operation, the pn junction is reverse-biased. With increasing voltage across the resistor, the depletion region around the pn junction will be enlarged, as a result of which the resistance zone is narrowed and its resistance value increases. Thus, it can be achieved that during normal operation of the circuit 1, in which the voltage does not exceed about 5 V at the input line 61, the operation of the circuit is substantially not delayed. A suitable value of the first and second series resistors $R_1$, $R_2$ is in this condition 300 Ω and 100 Ω, respectively. On the contrary, with an electrostatic discharge, in which just a very high voltage is applied to the input line, the resistance value of both series resistors $R_1$, $R_2$ will be considerably higher. The series resistors $R_1$, $R_2$ in this condition delay the voltage increases at the input line 61 in order to permit the third protection element 8C to become conducting before the voltage at the gate electrode 45, 55 has inadmissibly increased.

When an electrostatic discharge takes place, the third protection element will be the first to become conducting because of its comparatively low threshold value and will limit the voltage at the connection conductor 61 behind the second series resistor $R_2$ to about 8 V. The current then flowing through the second series resistor $R_2$ provides for a voltage drop across it, as a result of which the second protection element 8B with a threshold value of about 15-20 V also can become conducting. The voltage at the input line is then limited between the two series resistors $R_1$, $R_2$ to 10-15 V. At last also the first protection element 8A becomes conducting, as a result of which the released charge can be dissipated in a short time.

By carefully choosing the series resistors $R_1$, $R_2$, it can be ensured that the major part of the current through the first protection element 8A is dissipated. Thus, with an electrostatic discharge at the value for the series resistors $R_1$, $R_2$ used here, a current of the order of 100-500 mA and 10-20 mA, respectively, will flow through $R_1$ and $R_2$, respectively, while the current dissipated through the first protection element then can amount to 5 A or even a higher value.

Figure 28:
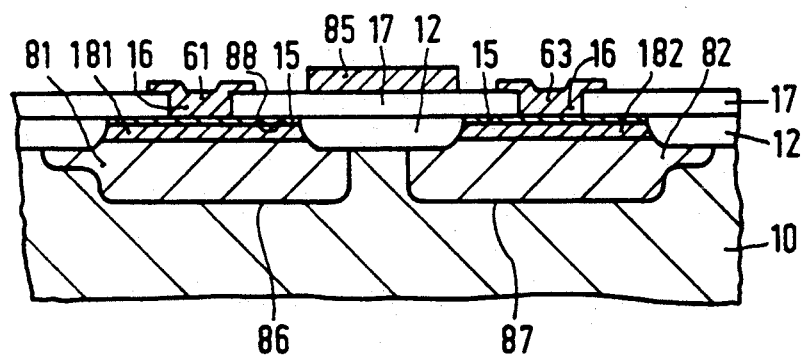
FIG. 28 shows a sixth embodiment of the semiconductor device according to the invention.

A sixth embodiment of the semiconductor device according to the invention is shown in cross-section in FIG. 28. In this Figure, the protection element 8 comprises a first active zone 81 and a second active zone 82, which are both n-type conducting and are mutually separated by a part of the p-type substrate 10. This part is located under a comparatively thick oxide layer 12, which is sunken into the substrate 10. The zones 81, 82 have a width of about 200 μm and are provided in the same processing steps as the n-well of the p-channel transistor. For a description thereof, reference is made to the first embodiment. The active zones 81, 82 are doped therein with phosphorus at a concentration of about $5 \times 10^{16}$ cm$^{-3}$, as a result of which their sheet resistance is about 15 kΩ/□.

For a satisfactory electrical contact to the active zones 81, 82, both zones 81, 82 are provided on either side of the oxide layer 12 at the surface with a higher doping for forming electrode zones 181 and 182, respectively. For the electrode zones 181, 182, use may be made of the source and drain implantation of the n-type transistors of the circuit (for a description thereof, reference is made to the first embodiment). The electrode zones 181, 182 are covered with titanium silicide 15 and the assembly is covered with a layer of silicon oxide 17. Via contact windows in the oxide layer 17, the first active zone 81 and the second active zone 82 are connected by means of aluminium electrodes 16 to the input line 61 and the second supply line 63, respectively. Between the active zones 81, 82, an aluminium gate electrode 85 is provided on the oxide layer 17 on behalf of the protection element.

Both active zones 81, 82 form with the p-type substrate 10 a pn junction 86 and 87, respectively, whose breakdown voltage is about 35 V. If the voltage at the input line 61 exceeds this voltage, the pn junction 86 of the first active zone 81 can break down, after which the protection element reaches the "snap-back" condition described above. In this condition, the protection element dissipates charge to the second supply line 63, the voltage at the input line 61 being limited to about 15 V. The current then flowing through the protection element is forced to flow through part of the comparatively weakly doped portion of the first active zone 81. Due to the comparatively high sheet resistance in this portion of the active zones 81, the current then meets a sufficient resistance to counteract convergence of the current. It is therefore not necessary in this embodiment to arrange an additional resistor before the protection element.

Although the invention has been described with reference to the embodiments given hereinbefore, it will be appreciated that the invention is not limited to these embodiments. Within the scope of the invention many further variations are possible for those skilled in the art.

For example, the resistance element and the protection element described in one embodiment may also be used in another embodiment. Moreover, the use of the invention is not limited to MOS circuits, but the invention may also be used, for example, in a semiconductor device comprising a bipolar circuit having, for example, silicidized emitters. The protection element may be constituted in this case by a bipolar transistor, for example an npn transistor, whose collector is connected to the connection conductor and whose emitter is coupled to the second contact area. By the use of the invention, also the life and hence the reliability can be increased.

In addition, in the case of a protection element having a number of active zones, a number of resistance elements may be used, which according to the invention are each individually connected to an active zone. Thus, a further increase of the overall series resistance can be achieved, for which in certain cases no additional space is required.

Further, it should be noted that, although the invention has been described above mainly with reference to a protection circuit between an input line and a supply line, the invention may also be used, for example, in the protection circuit between an output line and a supply line or between two supply lines or in the integrated circuit itself.

We claim:

1. A semiconductor device having charge protective structure comprising
   (a) an integrated circuit having at least one transistor disposed in a semiconductor body, said integrated circuit including surface zones at a surface of said semiconductor body, said surface zones being covered with metal silicide,
   (b) protection means being connected in parallel between a first connection line to said integrated circuit and a second connection line to said integrated circuit for protecting said integrated circuit through said first connection line by directing excess electrical energy through said protection means to said second connection line, said protection means including at least one semiconductor element for controlling voltage to said integrated circuit, said semiconductor element comprising at least one semiconductor zone disposed in said in said semiconductor body at said surface, said semiconductor element being covered by metal silicide, said semiconductor zone forming a pn-junction with a surrounding portion of said semiconductor body, and said semiconductor zone being provided with an electrode for electrical connection, and
   (c) resistance means connected between said first connection line and said semiconductor zone for reducing excess voltages applied to said integrated circuit through said first connection line, said resistance means being in series with said semiconductor element, and disposed between said electrode and said semiconductor zone, said resistance means having a width substantially equal to a width of said semiconductor zone.

2. A semiconductor device according to claim 1, wherein said semiconductor element of said protection means includes a transistor having a first active zone separated from a second active zone by a gate region, said first active zone and said second active zone forming pn junctions with said semiconductor body, said second active zone being connected to said second connection line through said metal silicide, and wherein said first active zone is covered with said metal silicide.

3. A semiconductor device according to claim 2, wherein said resistance means includes a resistance element of a first resistance zone and a second resistance zone, said first resistance zone having a first portion contacting said first connection line through said metal silicide, and said first resistance zone having a second portion contacting said second resistance zone, wherein said second resistance zone further contacts a portion of said first active zone, said first active zone having a remaining portion forming said pn junction with said semiconductor body, and wherein said first resistance zone is of higher conductivity than said second resistance zone.

4. A semiconductor device according to claim 3, wherein said second resistance zone has a lateral extent substantially equal to a lateral extent of said first active zone.

5. A semiconductor device according to claim 2, wherein said resistance means includes a resistance element separated from said semiconductor body by an insulating layer, said resistance element being formed by a plurality of separate and parallel strips, each of said plurality of separate strips being covered by said metal silicide and being joined at a first end opposite to said protection means, said first end being connected to said first connection line through said metal silicide, and wherein each of said separate and parallel strips is connected to said first active zone of said protection means by a metal strip at a second end of said resistance element adjacent to said first active zone, said metal strip contacting said first active zone through said metal silicide.

6. A semiconductor device according to claim 5, wherein said resistance element is doped polycrystalline silicon.

7. A semiconductor device according to claim 5, wherein said plurality of strips of said resistance element are separated by a distance of about 4 $\mu$m, and wherein each of said plurality of strips have a width of about 1 $\mu$m and a length ranging from 5 to 20 $\mu$m.

8. A semiconductor device according to claim 2, wherein said resistance means includes a resistance element disposed within said semiconductor body with a plurality of parallel strips of said metal silicide disposed onto respective strips of said first active zone overlying said resistance element, wherein said plurality of strips are interconnected at a side remote from said first active zone, and wherein said first connection line contacts said metal silicide in a plurality of areas relative to said plurality of strips.

9. A semiconductor device according to claim 8, wherein said plurality of strips are about 10 $\mu$m long and each strip is about 1 $\mu$m wide.

10. A semiconductor device according to claim 8, wherein said resistance element extends below insulating material at areas uncovered by said strips of metal silicide.

11. A semiconductor device according to claim 1, wherein said semiconductor element of said protection means is a diode, said diode including a first active zone of one conductivity type and a second active zone of a second conductivity type, wherein said first active zone forms a pn junction with second active zone, and wherein said first active zone has a sheet resistance of about 15 k $\Omega$/square to form said resistance means.

12. A semiconductor device according to claim 11, wherein said first active zone is connected to said first connection line through said metal silicide, and wherein said second active zone is connected to said second connection line through said metal silicide.

13. A semiconductor device according to claim 12, wherein a first contact zone of said one conductivity type is disposed between said first active zone and said metal silicide, said first contact zone being of a higher conductivity than said first active zone, and wherein a second contact zone of said second conductivity type is disposed between said second active zone and said metal silicide, said second contact zone being of a higher conductivity than said second active zone.

14. A semiconductor device according to claim 1, wherein said protection means includes a first diode protection element connected in parallel between said first connection line and said second connection line, a second transistor protection element connected in series with said resistance means between said first connection line and said second connection line, and a third transistor protection element connected in parallel between said first connection line and said second connection line.

15. A semiconductor device according to claim 14, wherein a first series resistor is disposed in said first connection line before the parallel connected second transistor protection element, and a second series resistor is disposed in said first connection line after said parallel connected second transistor protection element, and wherein said first and second series resistors delay any excess electrical energy in said first connection line to enable said third transistor protection element to become conducting to said second connection line first, then said second transistor protection element becomes conducting to said second connection line, and finally said first diode protection element becomes conducting to said second connection line.

16. A semiconductor device according to claim 1, wherein said semiconductor element of said protection means is a transistor, said transistor including a first active zone of one conductivity type, a second active zone of said one conductivity type, and a thick oxide gate region separating said first active zone from said second active zone, wherein a first contact zone of said one conductivity type is disposed on at least a portion of said first active zone and a second contact zone of said one conductivity type is disposed on at least a portion of said second active zone, said first and second contact zones being of higher conductivity than said first and second active zones, and wherein said first connection line contacts said first contact zone through said metal silicide and said second connection line contacts said second contact zone through said metal silicide.

17. A semiconductor device according to claim 16, wherein said first active zone has a sheet resistance of about 15 k$\Omega$/square to form said resistance means.

18. A semiconductor device according to claim 1, wherein said metal silicide is titanium silicide.

* * * * *